(12) United States Patent
Huibers et al.

(10) Patent No.: US 7,362,494 B2
(45) Date of Patent: Apr. 22, 2008

(54) MICROMIRROR DEVICES AND METHODS OF MAKING THE SAME

(75) Inventors: Andrew Huibers, Sunnyvale, CA (US); Hongqin Shi, San Jose, CA (US); James C. Dunphy, San Jose, CA (US); Satyadev Patel, Palo Alto, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/734,442

(22) Filed: Apr. 12, 2007

(65) Prior Publication Data

US 2007/0241417 A1    Oct. 18, 2007

Related U.S. Application Data

(60) Provisional application No. 60/792,362, filed on Apr. 13, 2006.

(51) Int. Cl.
*G02B 26/00*    (2006.01)
(52) U.S. Cl. .................. 359/291; 359/290; 359/223
(58) Field of Classification Search ............... 359/291, 359/223, 224, 290, 292, 295, 298
See application file for complete search history.

(56) References Cited

U.S. PATENT DOCUMENTS 6,849,471 B2 *    2/2005    Patel et al. .................. 438/21

* cited by examiner

*Primary Examiner*—Timothy Thompson
(74) *Attorney, Agent, or Firm*—W. James Brady, III; Fredrick J. Telecky, Jr.

(57) ABSTRACT

A method for making a micromirror device comprises is disclosed herein.

21 Claims, 16 Drawing Sheets

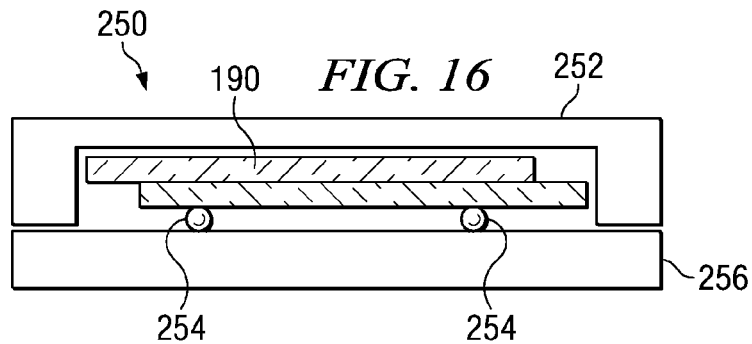
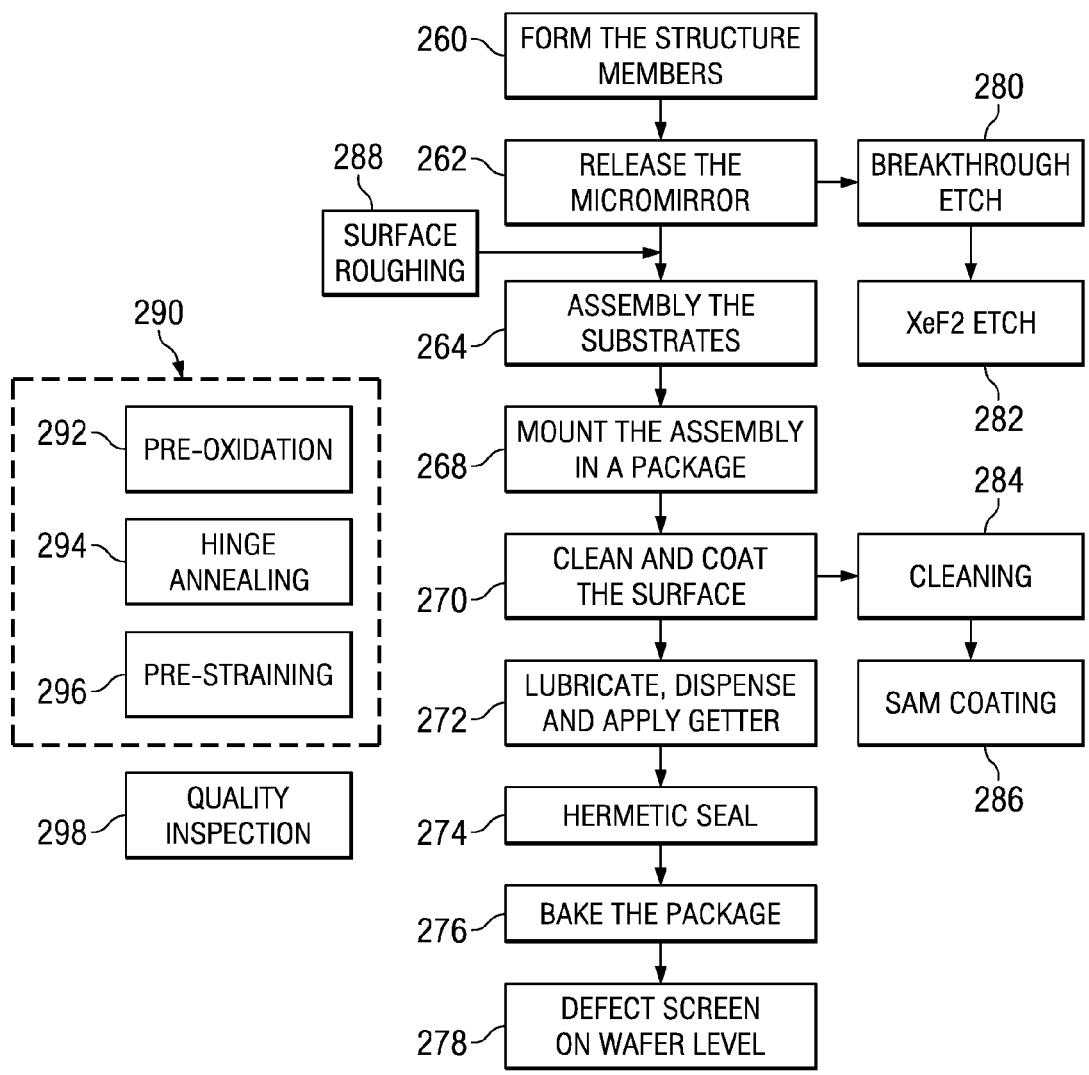

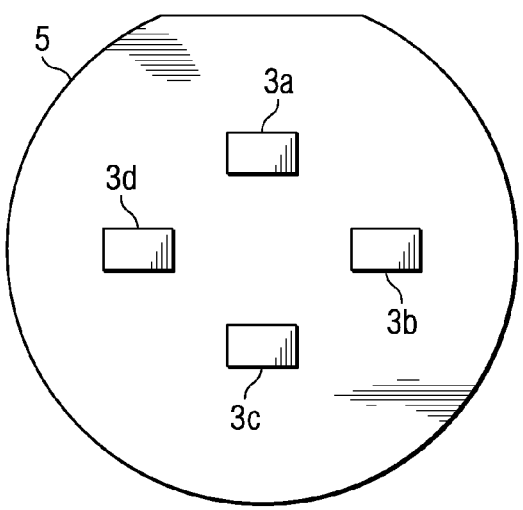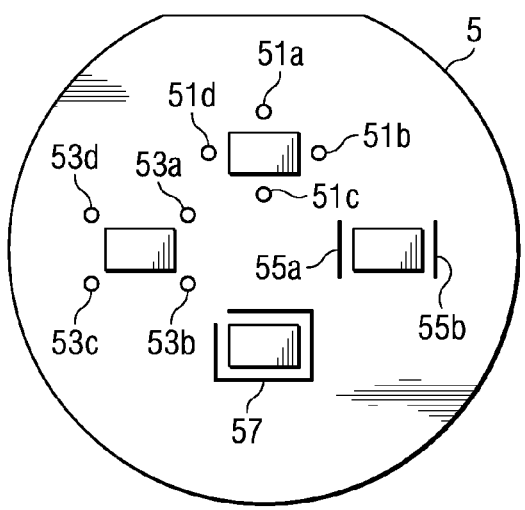
FIG. 21A  FIG. 21B
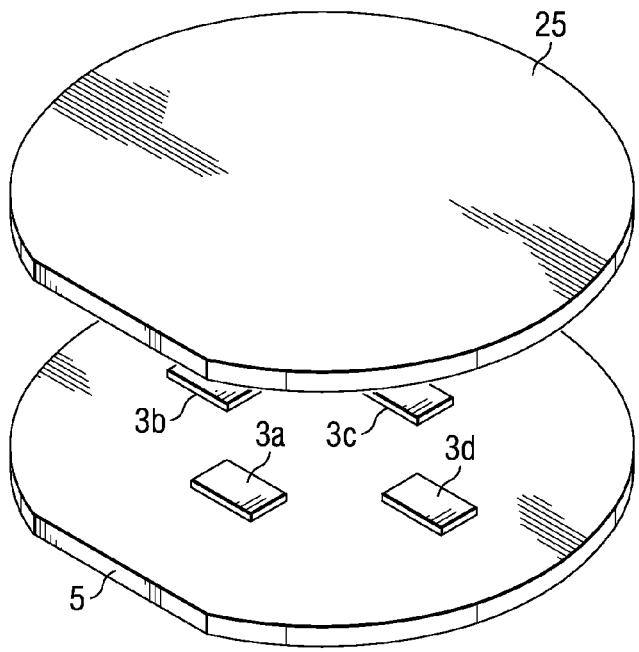
FIG. 21C
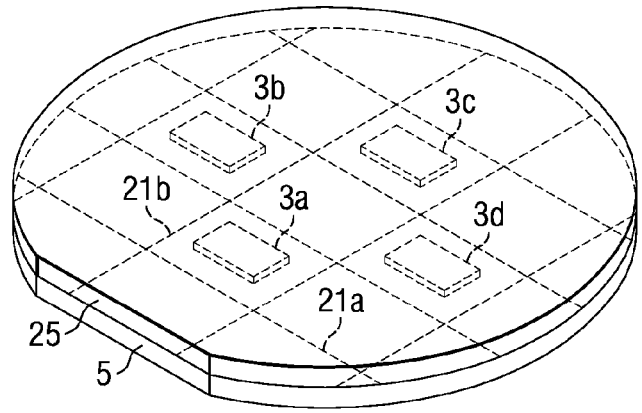
FIG. 21D

MICROMIRROR DEVICES AND METHODS OF MAKING THE SAME

This application claims priority under 35 USC § 119(e)(1) of provisional Application No. 60/792,362, filed Apr. 13, 2006.

TECHNICAL FIELD OF THE INVENTION

The present invention is generally related to the art of microstructures, and more particularly, to micromirror array devices for use in display systems.

BACKGROUND OF THE INVENTION

Microstructures, such as microelectromechanical devices, have many applications in basic signal transduction. For example, a spatial light modulator based on a microelectromechanical device (MEMS) modulates light beams in response to electrical or optical signals. Such a modulator can be a part of a communication device or an information display. For example, micromirrors are key components of MEMS-based spatial light modulators. A typical MEMS-based spatial light modulator usually consists of an array of miniature reflective deflectable micromirrors. These micromirrors can be selectively deflected in response to electrostatic forces so as to reflect incident light by individual micromirrors for producing digital images. Such micromirrors, however, are sensitive to temperature and contamination, such as moisture and dust. This contamination has varying effects on the micromirrors, from capillary-condensation and post-release stiction to deterioration of the micromirror surfaces, which may result in mechanical failure of the micromirror devices in operation. For this and other reasons, micromirror devices are often packaged after releasing.

Regardless of differences of the packaging methods currently developed for a micromirror array device, two substrates, one for supporting the device and another one for covering the device, and sealing medium(s) for bonding the two substrates are utilized. Most of the sealing mediums require application of heat during bonding and sealing. The heat, however, may degrade the micromirror array device if not properly applied, especially for those microstructures and semiconductor devices that are temperature sensitive. For example, improperly applied heat may change the desired mechanical properties of the microstructures. It may also thermally activate particles, such as impurities and particles making up the functional components of the microstructures, prompting diffusion of these activated particles within the microstructures, thus exacerbating degradation of the microstructures. Or heat may decrease anti-stiction materials within the package. The micromirrors of the present invention modulate the light incident thereon into different spatial directions such that the modulated light produce "black" and "dark" pixels in the display target. With a color wheel provided and a PWM method employed, color images can be produced on the display target in the same way as a black-and-white image.

Therefore, a method and an apparatus are needed for packaging microstructure, semiconductor, light emitting device, light modulating device, or light detecting device, particularly those that are temperature sensitive during packaging.

SUMMARY OF THE INVENTION

In view of the forgoing, the present invention discloses a micromirror device and a method of making the micromirror device. Objects and advantages will be obvious and will, in part, appear hereinafter, and will be accomplished by the present invention. Such objects of the invention are achieved in the features of the independent claims attached hereto. Preferred embodiments are characterized in the dependent claims.

BRIEF DESCRIPTION OF THE DRAWINGS

While the appended claims set forth the features of the present invention with particularity, the invention, together with its objects and advantages, may be best understood from the following detailed description taken in conjunction with the accompanying drawings of which:

FIG. 16 illustrates a cross-section of another package having a micromirror array device sealed therein;

FIG. 17 is a flow chart having steps executed in fabricating a micromirror array device according to an embodiment of the invention;

FIG. 20b illustrates a light transmissive substrate having an array of micromirrors formed thereon to be assembled to the electrode and circuitry array on the semiconductor substrate in FIG. 20a;

FIG. 21a illustrates a semiconductor wafer having a plurality of electrode dies each of which comprises an array of electrodes and circuitry;

FIG. 21b illustrates a light transmissive wafer having a plurality of micromirror dies each of which comprises an array of micromirrors;

FIG. 21c illustrates an electrode array wafer and a micromirror array wafer with microstructures being brought into contact with each other;

FIG. 21d illustrates a micromirror wafer and electrode and circuitry wafer bonded together;

FIG. 22b is a cross-section view of the assembled electrode and circuitry wafers in FIG. 22a;

DETAILED DESCRIPTION OF THE INVENTION

Projection System

Figure 1:
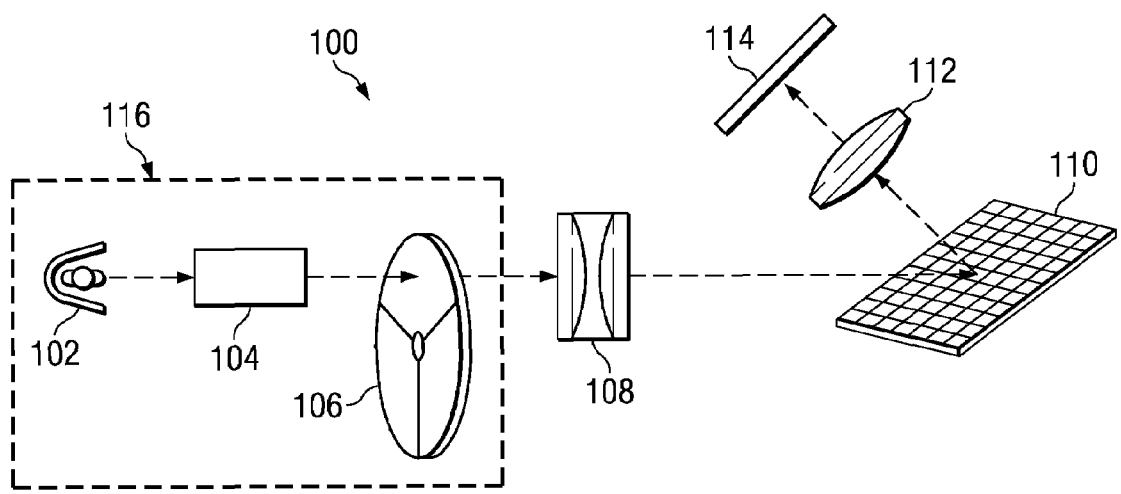
FIG. 1 illustrates an exemplary display system having a spatial light modulator in which embodiment of the invention can be implemented.

Turning to the drawings, FIG. 1 illustrates an exemplary display system having a spatial light modulator in which embodiment of the invention can be implemented. In its basic configuration, the display system comprises illumination system 116, optical elements 108 and 112, spatial light modulator 110, and display target 114.

The illumination system provides primary color light that are sequentially applied to the spatial light modulator. In an exemplary configuration, the illumination system comprises light source 102, which can be an arc lamp, lightpipe 104 that can be any suitable integrator of light or light beam shape changer, and color filter 106, which can be a color wheel. In this particular configuration, the color wheel is positioned after the light source and lightpipe on the propagation path of the illumination light from the light source. Other optical configurations can also be used, such as placing the color wheel between the light source and the lightpipe. Optical element 108, which can be a condensing lens, directs the primary color light onto the spatial light modulator in which the primary color light is reflected either into or away from projection lens 112 so as to generate a desired image pattern in the display target. The set of primary colors can comprise any set of three or more colors used to render the output image.

Spatial Light Modulator

Figure 2:
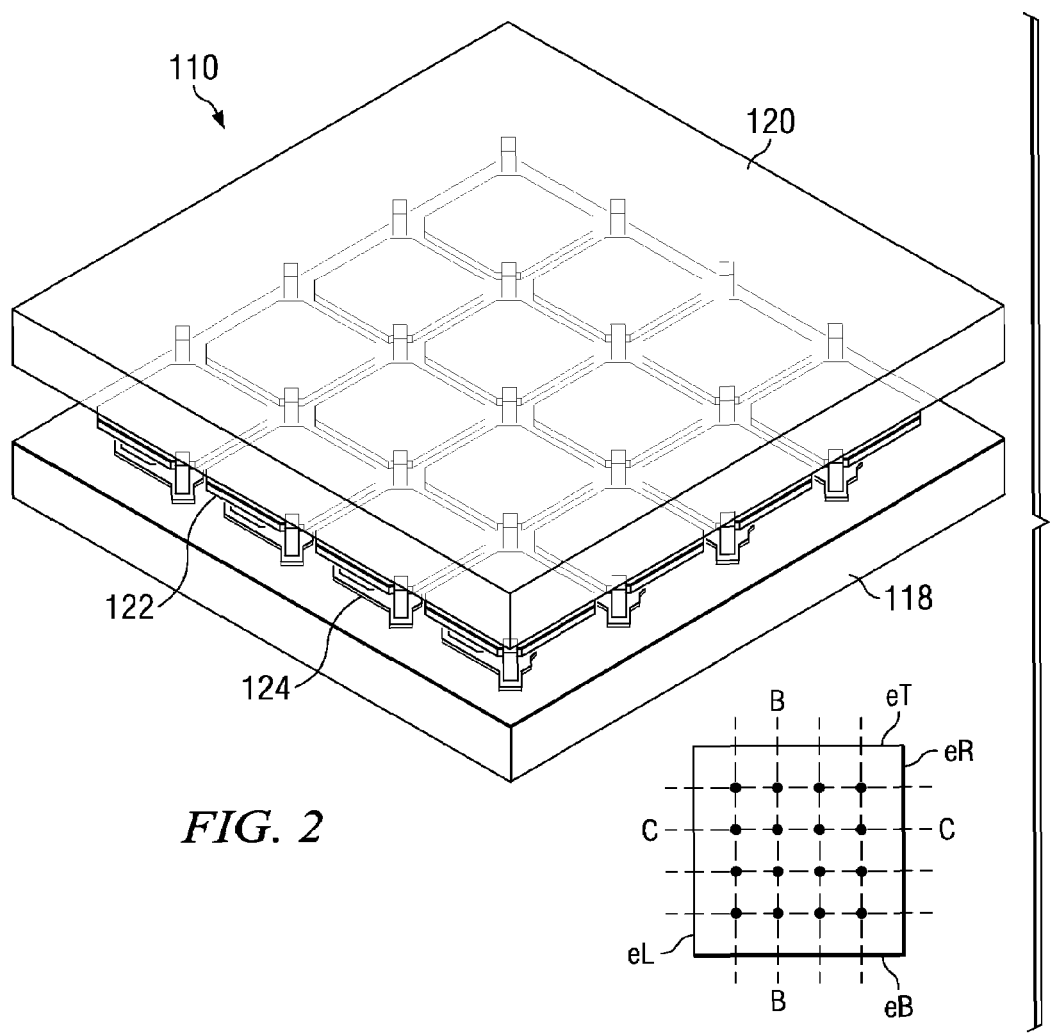
FIG. 2 is a perspective view of an exemplary spatial light modulator comprising an array of micromirrors.

FIG. 2 illustrates an exemplary micromirror-based spatial light modulator of the display system in its perspective view. Spatial light modulator 110 comprises an array of reflective deflectable micromirrors 122 formed on substrate 120, which is preferably a light transmissive substrate, such as glass or quartz. For individually deflecting the micromirrors, an array of electrodes and circuitry 124 is provided with at least one electrode being associated with a micromirror. In operation, electrostatic fields are established between the deflectable reflective mirror plates of the micromirrors such the mirror plates can be rotated by the electrostatic forces derived from the established electrostatic fields. By controlling the strengths of the electrostatic forces via for example, the data stored in the memory cells connected to the electrodes, different rotation angles of the mirror plates can be achieved. In a display system operates in binary-states including an ON and OFF state, the micromirrors of the spatial light modulator switch between the ON and OFF state in response to electrostatic fields. In order to generate grayscale images, the micromirrors are turned on and off at a rate faster than the human eyes can perceive such that the pixels of the displayed image appear to have an intermediate intensity proportional to the fraction of the time when the micromirror is on. For this purposes, the voltages applied to the electrodes, thus the strengths of electrostatic fields between the electrodes and the mirror plates of the micromirrors need to be switched between an ON state voltage and an OFF state voltage. The OFF state voltage can be zero (0) volt under which the mirror plates return to the OFF state (e.g. a natural resting state) from the ON state. Alternatively, the OFF state voltage can be non-zero. In order to achieve various levels of perceived light intensities by human eyes using pulse-width-modulation, durations of the ON (or OFF) state voltages on the micromirrors correspond to the significances of the date bits in which the ON (or OFF) state voltages are stored.

The spatial light modulator of the display system generally consists of millions of micromirrors, the total number of which determines the resolution of the displayed images. For example, the micromirror array of the spatial light modulator may have 1024×768 or higher, 1280×720 or higher, 1400×1050 or higher, 1600×1200 or higher, or 1920×1080 or higher number of micromirrors. For achieving a high resolution and optical efficiency while maintaining the same dimension of the micromirror array so as to be compatible with a small size arc cylinder (e.g. 1.0 mm or shorter) of the arc lamp in the illumination system, the micromirror array preferably has certain dimensions as set forth ion U.S. patent application P109 (small pixels, small pitch etc). For example, the micromirror array preferably has a pitch of 10.16 micrometers or less or from 4.38 to 10.16 micrometers with the pitch defined as the distance between adjacent micromirrors in the micromirror array. The gap between adjacent micromirrors is preferably 0.5 micrometers or less, or from 0.1 to 0.5 micrometer. The vertical distance between the mirror plates and the hinges is preferably from 0.15 to 0.45 micrometers or from 0.5 to 1.5 micrometers.

The micromirrors in the micromirror array can be arranged in different ways. In the micromirror array as shown in FIG. 2, the centers of the micromirrors form an orthogonal lattice, as shown in the figure insert, wherein each black circle represents a center of a micromirror. By "orthogonal lattice," it is meant that the virtual lines connecting the centers of the lattice in one nearest-neighboring direction (e.g. BB direction) are parallel to each other, and are orthogonal to the virtual lines connecting the centers in another nearest-neighboring direction (e.g. CC direction). A nearest-neighboring direction is a direction along which the neighboring centers have the least distance. In the example shown in FIG. 2, nearest-neighboring direction BB of the micromirror array is parallel to edges eL and eR of the micromirror array and orthogonal to edges eT and eB. Another nearest-neighboring direction CC, however, is parallel to edges eT and eB, while orthogonal to edges eL and eR. The micromirrors are positioned at the centers of the orthogonal lattice. When the mirror plates of the micromirrors are substantially square, the micromirrors can be arranged in the micromirror array such that the edges of each mirror plate are parallel to both of a nearest-neighboring direction and an edge of the micromirror array, while orthogonal to another nearest-neighboring direction and another edge of the micromirror array. In another example, the micromirrors can be arranged in the micromirror array such that the edges of the mirror plates are neither parallel nor perpendicular to either the edges of the micromirror array or the nearest-neighboring directions, as shown in FIG. 3.

Figure 3:
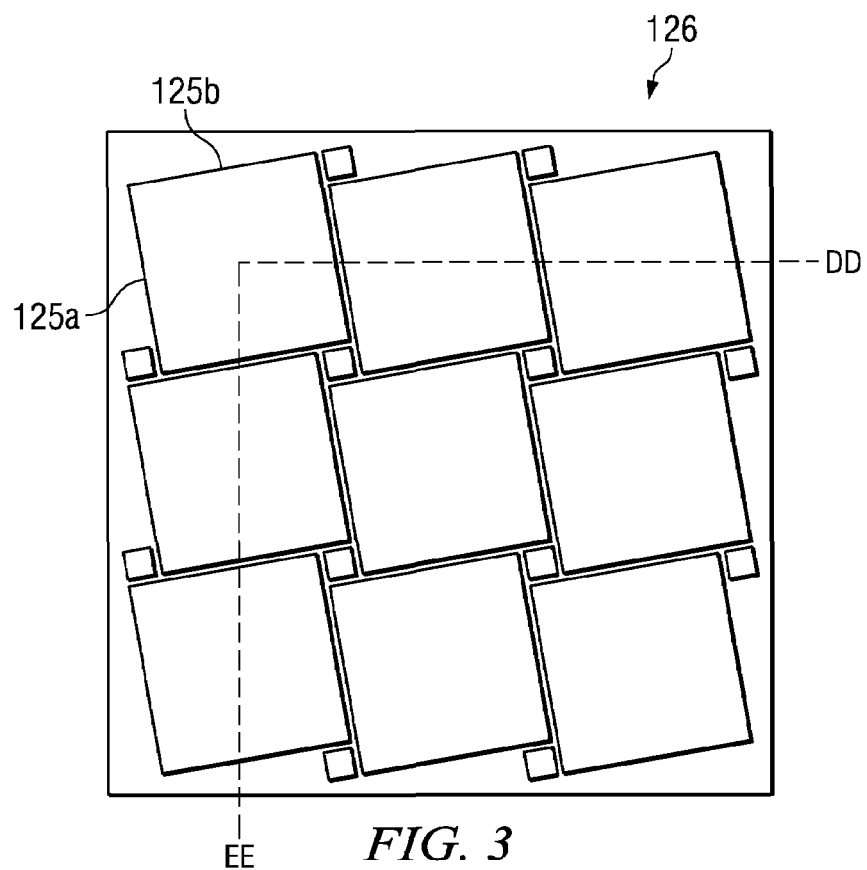
FIG. 3 is a top view of a portion of a micromirror array comprised of the spatial light modulator of FIG. 1.

Referring to FIG. 3, each mirror plate is titled an angle around its geometric center. As a result, mirror edge 125*a*, for example, is neither parallel nor orthogonal to either the edge of the micromirror array or the nearest-neighboring directions DD and EE, so does the edge 125*b*. The titled angle of the mirror plates can be of any degrees except (n−45)°, wherein n is a non-zero integer. For example, the titled angle can be from 2° to 30°, though more likely within the range of from 5° to 25° degrees, (e.g. from 10° to 20° degrees, or around 15° degrees).

Figure 4:
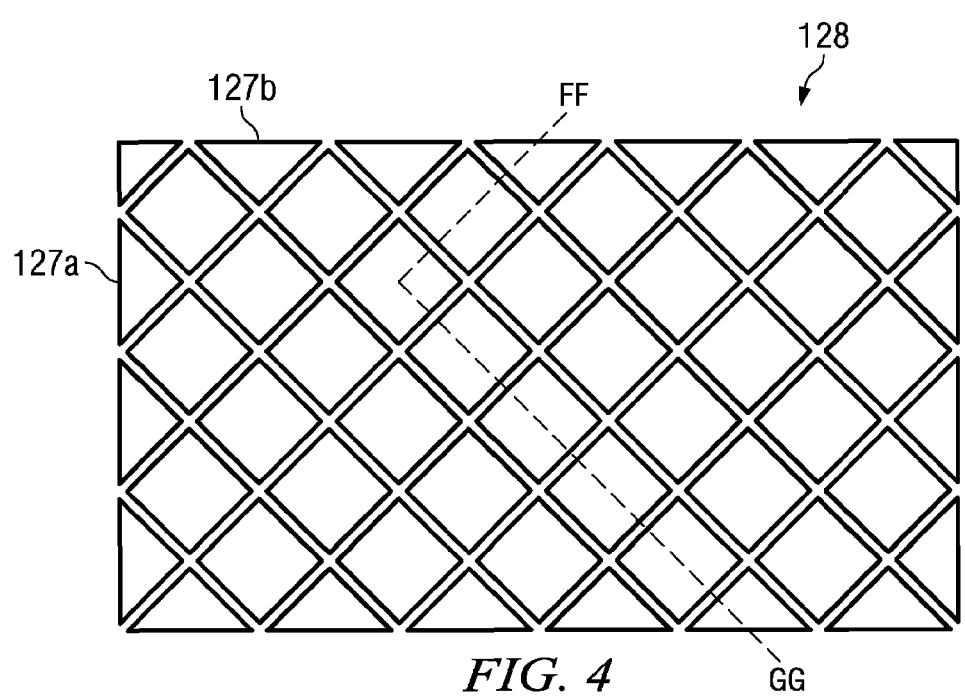
FIG. 4 is top view of a portion of another micromirror array comprises of the spatial light modulator in FIG. 1.

FIG. 4 illustrates a portion of a micromirror array with each micromirror rotated −45° around its geometric center. As a consequence, the nearest-neighboring directions FF and GG are neither parallel nor perpendicular to the edges of the micromirror array. In particular, nearest-neighboring direction FF is 45° degrees (or 135° degrees) from edge 127*a* of the micromirror array, and 135° degrees (or 45° degrees) form edge 127*b* of the micromirror array. Nearest-neighboring direction GG can be perpendicular to the nearest-neighboring direction FF. The edges of the mirror plate of the individual micromirror can be parallel to one nearest-neighboring direction, and perpendicular to another. However, the edges of the mirror plates are neither parallel nor perpendicular to the edges of the micromirror array (e.g. 127*a* and 127*b*).

Exemplary Micromirrors

Figure 5:
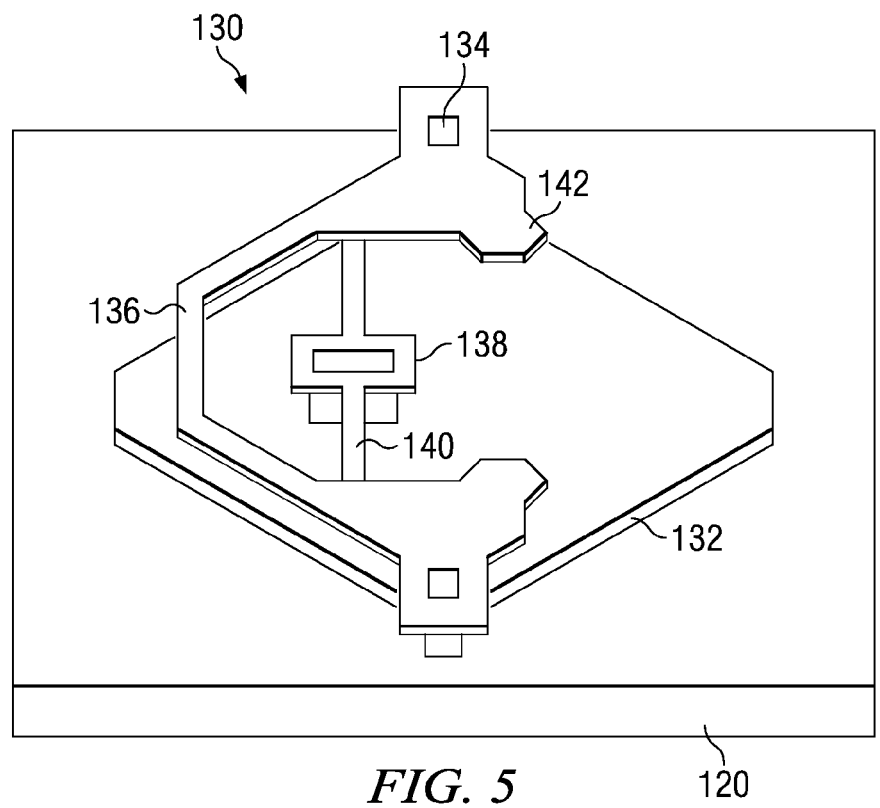
FIG. 5 is a perspective view of an exemplary micromirror of the micromirror array in FIG. 2.

The micromirrors in the micromirror array can be of any desired configurations, one of which is illustrated in FIG. 5. Referring to FIG. 5, micromirror 130 comprises reflective and deflectable mirror plate 132 that attached to deformable hinge 140. The hinge is held by hinge support 136 that is formed on substrate 120 and connected to the substrate via posts 134. The substrate is preferably a light transmissive substrate, such as glass or quartz. Alternatively, the substrate can be a semiconductor substrate on which standard circuitry can be fabricated. In this particular example, two posts, each positioned at one of the two ends of the mirror plate along a diagonal, are provided for supporting the hinge support above the substrate. When the micromirror is part of a micromirror array, the hinge structure can be connected to the hinge structures of the adjacent micromirrors in the array to form a hinge structure strip, and only one or even no post can be provided. In this instance, the hinge support of the micromirror is supported and held by the hinge support strip to which the hinge support of the micromirror without post is connected, which will be discussed with reference to FIGS. 7 to 8*b* afterwards.

The deformable hinge is preferable a torsion hinge, and is held by hinge support above the substrate. The mirror plate is attached to the deformable hinge via hinge contact 138 such that the mirror plate can rotate above the substrate. Because the quality, such as the contrast ratio of the displayed images is predominantly determined by the reflected light from the mirror plate at the ON and OFF state, it is desired that reflected light cones from the ON and OFF state can be separated as far away as possible, as set forth in U.S. patent application P90-US, the subject matter being incorporated herein by reference. For this purpose, the micromirror is constructed such that the mirror plate rotates asymmetrically to the ON and OFF state—that is, the mirror plate is operable to rotate to a larger angle in the ON state than in the OFF state. For example, the mirror plate rotates to an ON state angle that can be 12° degrees or more, or 16° degrees or more, or 20° degrees or more. While the mirror plate can rotate to an OFF state angle that can be 0 (zero) degree, or −2° degrees, or −4° degrees, wherein the minus sign "−" represents an opposite rotation direction to the rotation towards the ON state. To achieve this asymmetric rotation, the mirror plate is attached to the hinge at an attachment point that is neither at the geometric center of the mirror plate nor at a diagonal of the mirror plate when viewed from the top. The mirror plate can also be attached to the hinge such that the rotation axis of the mirror plate is parallel to but offset from a diagonal of the mirror plate when viewed from the top, even though rotation axis may revolve around a stationary axis of the micromirror, such as the virtual line connecting the posts.

The shape of the mirror plate also has effect on the quality of the displayed images because the shape of the mirror plate can affect the light scattering from the mirror plate. For reducing the light scattering so as to improve the quality, such as the contrast ratio of the displayed images, the mirror plate preferably has a shape of substantially square, or jagged edges as set forth in U.S. patent applications P022-US and P090-US, the subject matter of each being incorporated herein by reference. The mirror plates may have other shapes, such as rectangle, rhombus, trapezoid, or V-shape.

Figure 6:
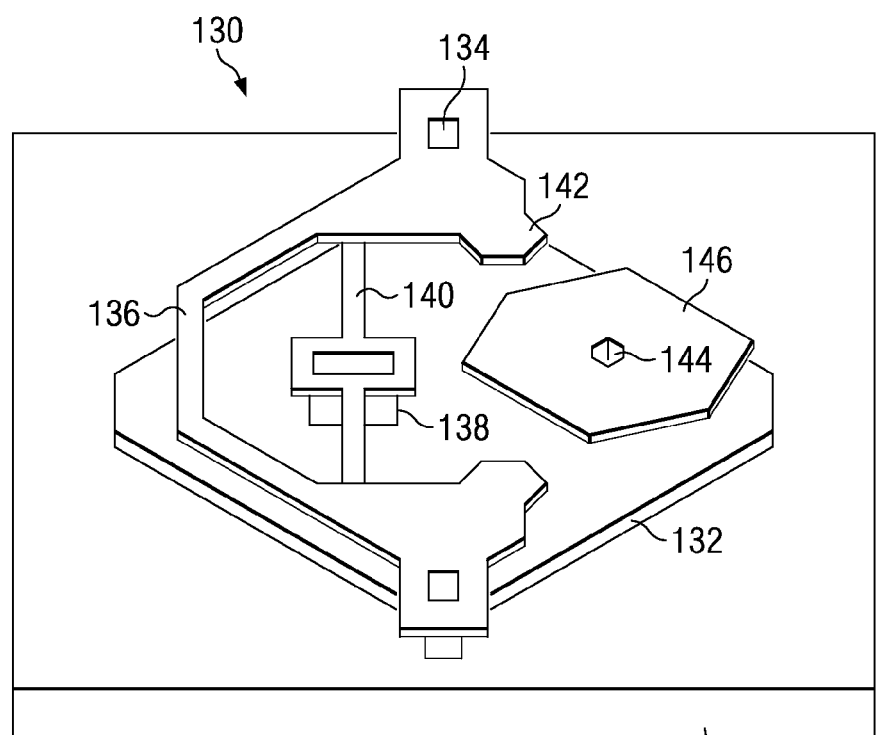
FIG. 6 is a perspective view of another exemplary micromirror of the micromirror array in FIG. 2.

In addition to the features introduced above, the micromirror may have other features, such as the stopping mechanisms. As shown in FIG. 5, stoppers 142 are formed on the hinge support for stopping the rotation of the mirror plate when the mirror plate is at the ON state angle. The positions and lengths of the stoppers are designed according to the desired ON state angle. In addition to the stoppers, extension plate 146 may be formed on the mirror plate so as to enhance the coupling between the mirror plate and the applied electrostatic field, as shown in FIG. 6, which is detailed in U.S. patent application P108-US, the subject matter being incorporated herein by reference. Referring to FIG. 6, extension plate 146 is formed on mirror plate 132 and connected to the mirror plate via post 144, wherein post 144 is positioned neither at the center of the mirror plate nor a diagonal of the mirror plate when viewed from the top. The extension plate is connected to substrate 120 through the mirror plate, the hinge contact, the hinge, the hinge support, and the posts.

Electrodes and Circuitry

For individually addressing and deflecting the micromirrors, an array of electrodes and circuitry are positioned proximate to the locations of the micromirrors with each electrode being associated with a micromirror, as set forth in U.S. patent provisional application Ser. No. 60/582,446, filed Jun. 23, 2004, the subject matter being incorporated herein by reference. Specifically, the electrode is positioned proximate to the mirror plate and in a relative position to the mirror plate that the electrode extends beyond the mirror plate in a direction towards the furthest point of the mirror plate to the hinge of the micromirror. That is, for the given electrostatic field, the electrostatic force on the mirror plate can be maximized. As compared to a micromirror otherwise, the micromirror of the present invention allows for usage of a small voltage for driving the mirror plate to a desired angle. With such configuration, the micromirror of the present invention best utilizes a given electrostatic field applied for deflecting the micromirror. As a way of example, the mirror plate and the electrode are positioned such that an imaginary line connecting a geometric center of the mirror plate and a geometric center of the electrode is from 5° to 50° degrees relative to a line normal to the electrode. As another way of example, the electrode is positioned in relation to the mirror plate such that the mirror late is visible when viewed from directly above the mirror plate with the electrode positioned underneath and offset the mirror plate.

For applying and controlling the voltage on the electrode, a voltage storage, generally in the form of a memory cell is connected to the electrode. The memory cell can be in any suitable forms, such as RAM, DRAM, and Latch. In accordance with an embodiment of the invention, the memory cell is a charge-pump-memory cell, as set forth in U.S. patent application Ser. No. 10/340,162, filed Jan. 10, 2003, the subject matter being incorporated herein by reference. The charge pump memory cell in its basic configuration comprises a MOS-type transistor having a source, drain, and gate. The source is connected to a bitline through which data bit can be written to the memory cell. The gate is connected to a wordline for activating the memory cell, while the drain is connected to a plate of a capacitor forming a voltage node that is connected to the electrode. The other plate of the capacitor, however, is connected to a pumping signal whose voltage varies over time.

In operation, a data bit is stored in the memory cell, and the data bit determines the voltage of the electrode. The voltage of the mirror plates can be fixed as desired, for example, to zero or be grounded. By altering the data bit in the memory cell, the voltage applied to the electrode can be altered. Accordingly, the voltage difference between the mirror plate and the electrode associated with the mirror plate can be adjusted as desired. In response to such electrostatic field, in particular, driven by the electrostatic force derived from such electrostatic field, the mirror plate switches between the ON and OFF state for reflecting the incident light onto or away from the display target so as to produce desired images. In an exemplary configuration, an ON state electrode is provided for rotating the mirror plate to the ON state. When the OFF state is desired, the electrostatic field between the ON state electrode and the mirror plate is removed. The mirror plate returns to the OFF state under its internal restoration force, which was accumulated as the mirror plate being rotated to the ON state.

Switching of the mirror plate from the ON state to the OFF state can be enhanced by provision of an OFF state electrode as set forth in U.S. patent application Ser. No. 10/437,776, filed May 13, 2003, the subject matter being incorporated herein by reference. The OFF state electrode can be arranged at any appropriate locations with relative to the ON state electrode. For example, each micromirror comprises at least two electrodes for driving the micromirror plate to an ON state and an OFF state. The electrodes can be disposed on the same side relative to the micromirror plate but on opposite sides relative to the rotation axis of the mirror plate. Alternatively, all electrodes for the OFF state of all micromirrors can be formed as an electrode film deposited on the substrate on which the micromirrors are formed. This electrode film can also be an anti-reflection film for enhancing the transmission of light through the substrate. In order to reduce scattering and enhancing reflection of light, the ON state angle corresponding to the ON state is defined as different as the OFF state angle corresponding to the OFF state. In particular, the OFF state angle is smaller than the ON state angle and in the opposite direction of the ON state angle relative to a non-deflected state of the mirror plate. This asymmetric OFF state angle and ON state angle can be achieved by proper combinations of the electrodes with a plurality of rotation stopping mechanisms. For example, electrodes for the ON state and the OFF state can be used as the stops for the ON state and the OFF state. These electrodes are generally coated with dielectric materials for electrically isolating the electrode to avoid electric shorting. With proper geometric configurations of the electrodes, desired asymmetric OFF state angle and ON state angle can be obtained. For another example, designated stops for the ON state and/or the OFF state can be provided for defining the OFF state angle and the ON state angle. These stops can be formed on the substrate(s) and/or the hinge structure that holding the mirror plates. The electrodes of the second electrode array is preferably connected and forms a continuous electrode such that all electrodes of the second electrode "array" always stay at the same electric potential. In an operation, the electrodes of the second electrode array (the "second electrode") may be initiated by applying an electric potential between said electrodes and the mirror plates, and in response to this electric potential, all mirror plates are rotated to the OFF state. Then in response to an actuation signal, selected mirror plate(s) is (are) rotated to the ON state in response to an electric filed between the selected mirror plate(s) and the electrode(s) for the ON state. Apparently, in order to switch the mirror plate from the OFF state to the ON state, the electric force applied to the mirror plate by the electrode for the ON state should overcome the electric force applied to the mirror plate by the electrode for the OFF state.

Features of a Micromirror Array

Posts are Provided for Selected Micromirrors in a Micromirror Array

In the micromirror array as shown in FIG. 2 and the micromirrors as shown in FIGS. 5 and 6, each micromirror is provided with two posts for supporting the hinge support and the hinge so as to enable the rotation of the mirror plate above the substrate. In an alternative configuration, posts are provided for selected micromirrors in a micromirror array. The hinge supports of the micromirrors are interconnected, forming hinge support strips and/or hinge support frame(s) across the entire micromirror array. Posts are provided between the hinge support strips (and/or hinge support frame) and the substrate for supporting the hinge support strips (and/or frame). Specifically, the posts are connected to the hinge supports and the substrate. However, a hinge support may not have a post connected thereto, or a hinge may not have two posts connected thereto. In this situation, the hinge support without or with less than two posts is supported and held by the hinge support strips (and/or the hinge support frame) to which the hinge support is connected, as set forth in U.S. patent application attorney docket number P136-US to Huibers, filed on the same day as the current patent application, the subject matter being incorporated herein by reference.

Figure 7:
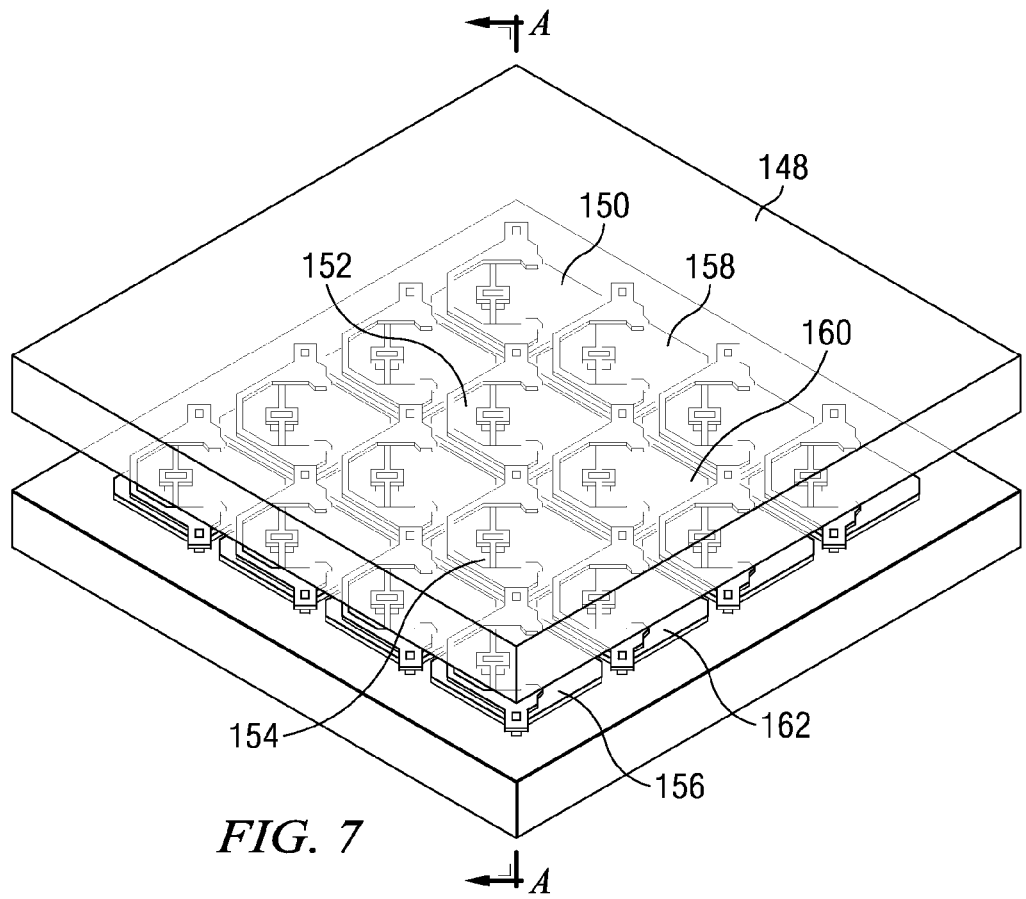
FIG. 7 is a perspective view from the bottom of a portion of a spatial light modulator in FIG. 1.
Figure 8A:
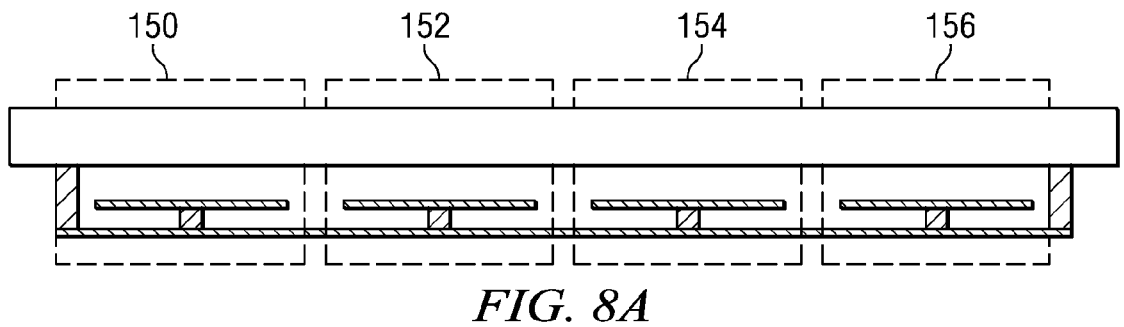
FIG. 8a is a side view of the micromirrors positioned along line AA in the spatial light modulator in FIG. 7.

As a way of example, FIG. 7 illustrates a micromirror array in which not all the micromirrors have posts. Referring to FIG. 7, the hinge supports of the micromirrors in the micromirror array are interconnected—forming hinge support strips in a particular direction. For example, the hinge supports of micromirrors 150, 152, 154, and 156 positioned along direction AA are connected together—forming a hinge support strip along direction AA. The direction AA may or may not be parallel to the edges of the micromirror array or a diagonal of the mirror plates of the micromirrors. In general, the direction AA is determined by specific configurations of the hinges supports of the individual micromirrors. Similarly, the hinge supports of micromirrors 158, 160, and 162 are connected together—forming another hinge support strip. A side-view of micromirrors 150, 152, 154, and 156 is illustrated in FIG. 8*a*. In this particular example, micromirrors 150 and 156 each are provided with only one post. As a result, the hinge support strip formed by the hinge supports of micromirrors 150, 152, 154, and 156 is supported by the posts of micromirrors including 150 and 156. The mirror plates of micromirrors 150, 152, 154, and 156 each are attached to the hinges of the micromirrors with the hinges are held and supported by the hinge support strip.

The posts can be provided for selected micromirrors in a micromirror array. The selection can be made according to a predetermined criterion. For example, the micromirrors to be provided with posts can be randomly selected from the micromirrors. Alternatively, every a particular number of micromirrors can be selected to be provided with one or more posts. In another embodiment of the invention, the selection of the micromirror having posts can be made depending upon the mechanical properties of the hinges, the hinge supports, and the mirror plates. As another way of example, FIG. 8*b* illustrates another possible configuration for the micromirrors in the micromirror array in FIG. 7 along line AA.

Figure 8B:
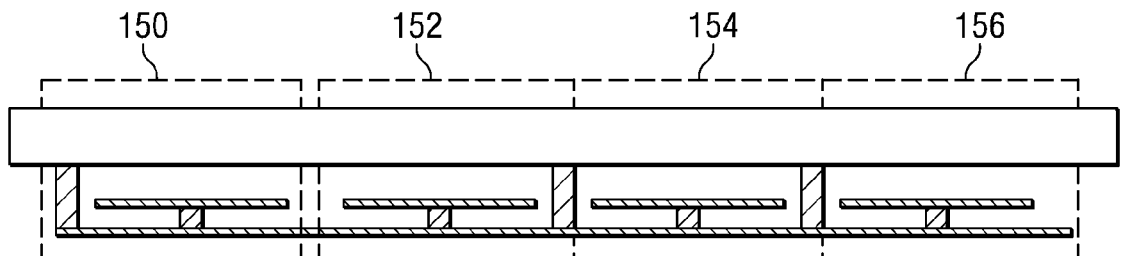
FIG. 8b illustrates an alternative configuration of the micromirrors in the spatial light modulator.

Referring to FIG. 8*b*, micromirror 154 has two posts each positioned at an end of a diagonal of the mirror plate. Micromirror 150 has only one post formed thereon, while micromirrors 152 and 156 have no posts. Because the mirror plates of the micromirrors are attached to their individual hinges each being held by a hinge support and the hinge supports of the micromirrors are connected together—forming a hinge support strip, the mirror plate of each micromirror is operable to rotate above the substrate.

Alternative to the hinge strips, a hinge support frame can be formed by the hinge supports of the micromirrors as set forth in U.S. Pat. No. 7,092,143 with an to Heureux, which will not be detailed herein. Moreover, a micromirror array may have both hinge support strips and hinge support frame(s), as well as hinge support(s) that is not connected to any other hinge supports.

In-Array Pillars

When the micromirror array and electrode array are fabricated on separate substrates as shown in FIG. 7, a uniform gap between the two substrates is often required for ensuring desired functions or performance of the microstructure. However, a uniform distance throughout the micromirror array may not be guaranteed in fabrication or in operation or in both due to deformation of the substrates on which the micromirrors and electrodes are formed. The deformation may arise from many factors, such as temperature change, variation of the pressure applied to the substrates and other factors, such as attractive or expellant electrostatic forces between the substrates when the substrates are electrically charged. The deformation changes the gap size, which in turn changes the effective strength of the electrostatic field. As a consequence, desired operation or performance of the device is not achievable.

In addition to the substrate deformation, other factors, such as operation environment (e.g. contamination and viscosity) may also degrade the operation and performance of the micromirror array device. Contamination is often solved by packaging the device, such as hermetically packaging the device. Viscosity problems arise from the viscosity resistance to the rotation of the mirror plate in a medium, such as air or the gas (e.g. an inert gas). The viscosity resistance to the movement of the mirror plate reduces the response time of the mirror plate and limits the application of the micromirror array device. In order to maintain a uniform gap between the substrates, a plurality of pillars is provided and distributed within the gap. The gap uniformity can further be enhanced by maintaining the pressure inside the gap below the pressure under which the microstructure device will be in operation, as set forth in U.S. patent application Ser. No. 10/869,539, filed Jun. 15, 2004, the subject matter being incorporated herein by reference.

Figure 9A:
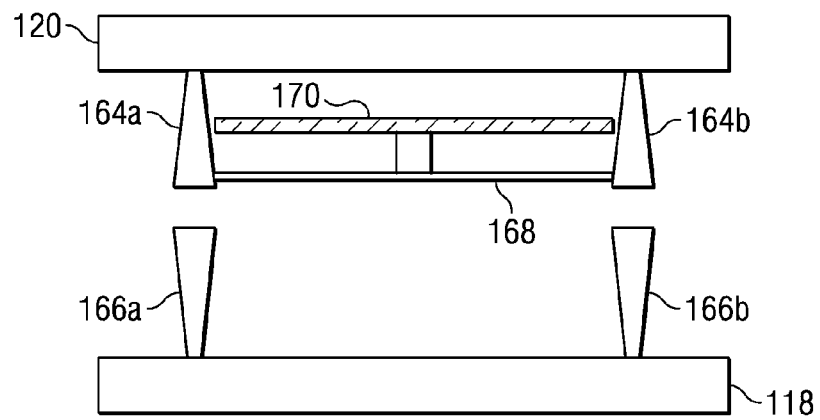
FIG. 9a illustrates a cross-section view of a micromirror device having in-array pillars.

As a way of example, FIG. 9*a* illustrates an exemplary micromirror device having pillars according to the invention. Referring to FIG. 9*a*, the micromirror comprises substrate 120 having posts 164*a* and 164*b* formed thereon. Deformable hinge 168 is held by the posts. Deflectable and reflective mirror plate 170 is attached to the deformable hinge such that the mirror plate and the hinge are located at different planes parallel to the substrate when the mirror plate is not deflected; and the mirror plate is operable to rotate relative to the substrate. For deflecting the mirror plate with an electrostatic force derived from an electrostatic field, an electrode formed on substrate 118 is positioned proximate to the mirror plate at a vertical distance such that an electrostatic force with sufficient strength to rotating the mirror plate can be produced between the mirror plate and the electrode.

For maintaining a uniform and constant distance between the mirror plate and the electrode, pillars 166*a* and 166*b* are connected to posts 164*a* and 164*b* of the micromirror. The pillars can also be connected to protrusions of the posts is provided which is not shown in the figure. In another embodiment of the invention, the micromirror has at most one pillar directly connected to a post of the micromirror. For example, pillar 166*a* or 166*b* is not provided for the micromirror. In fact, a micromirror in a micromirror array may have no pillars directly connected thereto, and the distance between the two substrates (thus the distance between the mirror plates and electrodes) can be maintained by other posts in the array, as better illustrated in FIG. 9*b*.

Figure 9B:
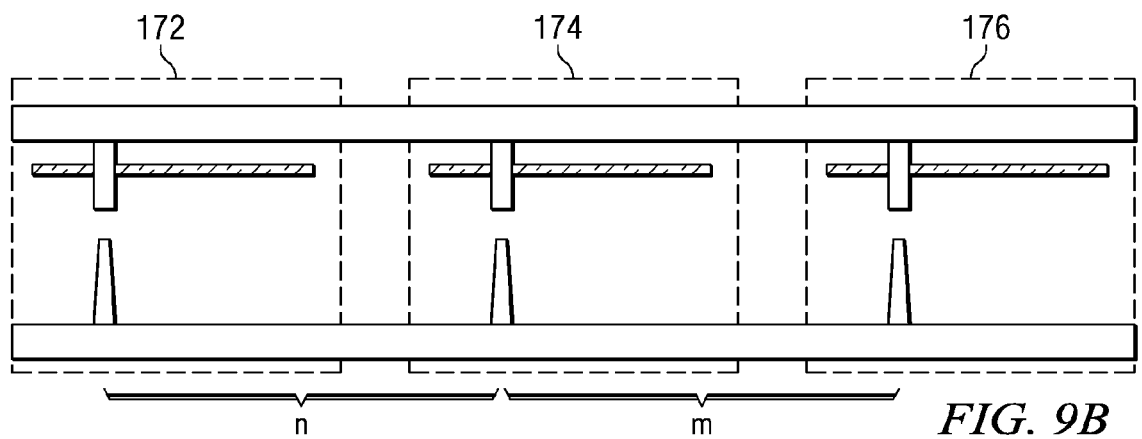
FIG. 9b illustrates a cross-section view of a portion of a micromirror array having a plurality of in-array pillars.

Referring to FIG. 9*b*, pillars are provided for micromirrors 172, 174, and 176. The micromirrors (with the number of n, wherein n is an integer and zero) between micromirrors 172 and 174 are not provided with pillars. And the micromirrors (with the number of m, wherein m is an integer and zero and may or may not be the same as n) between micromirrors 174 and 176 are not provided with pillars.

Features in an Assembly

Embedded Photo-Detector

In a micromirror array assembly having a first substrate with an array of micromirrors formed thereon; and a second substrate with an array of electrodes and circuitry formed thereon, other alternative features can be added. For example, a photodetector can be embedded in the second substrate having the electrodes and circuitry formed thereon as set forth in U.S. patent application Ser. No. 10/751,145, filed Jan. 2, 2004, the subject matter being incorporated herein by reference.

Figure 10:
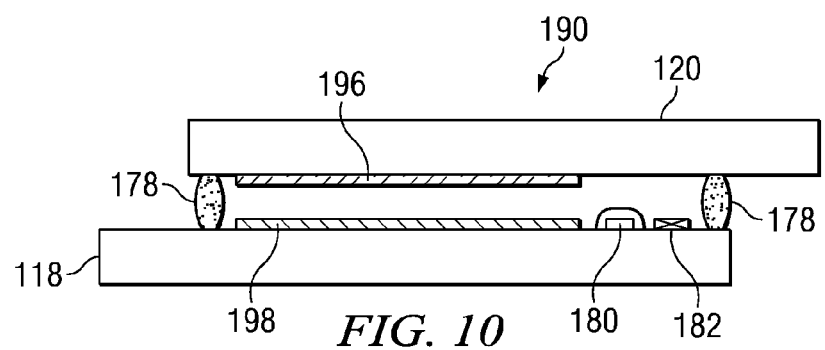
FIG. 10 illustrates a cross-section view of a micromirror array device having embedded photo-detector in a substrate of the micromirror device.

FIG. 10 illustrates a cross-sectional view of a micromirror array assembly having an embedded photodetector according to an embodiment of the invention. Assembly 190 comprises substrate 120 with micromirror array 196 formed thereon. Substrate 120 in this particular example is preferably transmissive to visible light. For deflecting the micromirrors, an array of electrodes and circuitry 198 formed on substrate 118 is positioned proximate to substrate 120. The two substrates are bonded through bonding material 178.

On the same substrate 118 on which the electrodes are formed, photo-detector 180 is fabricated for detecting a component of the light beam of a particular frequency, such as the red (or green or blue) component of the light beam. In operation, the photo-detector detects the occurrence of the light component of the particular frequency (e.g. red) and generates a timing signal. Occurrence of the remaining light components (e.g. green and blue) is derived from the timing of the light of the particular frequency according to the configuration of the color wheel and the rotation speed of the color wheel. In accordance with the timing signal and derived timings for the remaining light components, image data of different light components are sequentially loaded into the spatial light modulator so as to produce the desired image.

In general, a photo-detector may response to a light beam of a frequency range including the particular frequency. The strength of the response (e.g. the output current or voltage) varies with the light frequency. In an embodiment of the invention, the photo-detector presents a maximum response to the desired light component of the particular frequency. However, this is not always feasible, especially when the response to the desired light component (e.g. red) is so close to a response of another light component (e.g. blue) such that the two responses are not distinguishable. In this situation, color filtering film 182 can be disposed on the photo-detector for filtering the light components. Specifically, the color filtering component passes the desired light components (e.g. red color component) and blocks the rest color components (e.g. green and blue). According to the embodiment of the invention, the color filtering film can be a multilayered structure and comprises a dichroic filter designed for passing the desired color component and reflecting the remaining color components. The color filtering film can also be a dyed polymer such as polyimide.

The output current or voltage of the photo-detector is often small in amplitude. For this reason, the output response can be differentially amplified. For example, another photo-detector 182 is provided for detecting white light. The output responses of these two photo-detectors are amplified by a differential amplifier (not shown). The differentially amplified signal is then used as the timing signal for synchronizing the operation of the spatial light modulator. Photo-detector 182 can be fabricated in the same way as for photo-detector 180 in the semiconductor substrate but without a color filtering film.

Light Blocking Coating in an Assembly

In addition to the embedded photo-detector, the assembly may have other alternative features, such as light blocking coating, and anti-reflection films, and lubricant coating. Specifically, a light blocking coating may be deposited on either one of or both of the substrates. For example, a light blocking area can be deposited around the parameter of the micromirror array so as to absorb undesired scattered light from the components other than the reflective mirror plates of the micromirrors. A light blocking coating may also be formed within the micromirror array, such as around the individual micromirrors or around a group of micromirrors.

Alternatively, a light blocking film can also be formed on the substrate having thereon the electrode and circuitry array. Such light blocking coating may or may not be provided in the same way as the light blocking coatings on the substrate having the micromirrors as discussed above. Moreover, the light blocking coating on either one of the two substrate can be presented regardless of whether the other substrate has a light blocking coating or not.

The light blocking coating can be presented in the substrates in many forms. For example, the light blocking coating can be a film, strips, or frames, or any combinations of the above.

Lubricants in Glass Substrate

In operation, in-use stiction may occur in the contact area of the mirror plate and stopping mechanism (e.g. a substrate, an electrode, or a stopper) of the micromirror device. In order to prevent such in-use stiction, the micromirror device, especially the contact area, can be lubricated with a lubricant material that coats or physically reacts with the surface molecules of the contact area, as set forth in U.S. patent application Ser. No. 10/810,076, filed Mar. 26, 2003, the subject matter being incorporated herein by reference.

In accordance with the invention, the lubricant can be liquid (or paste) or solid. The lubricant may have a high boiling point (e.g. 100° C. or higher) or low vapor pressure such that the lubricant does not condense at low temperature or fully evaporate at high temperatures (e.g. 30° C. or more or 70° C. or more, or even 100° C. or more) (the high and temperature refer to the storage and operating range of the micromirror device). The lubricant is desired to be stable at a high temperature, such as 200° C. or higher. The viscosity of the lubricant in liquid phase can be of from 1 cP to 5000 cP. However, any desired lubricant can be used.

As an example, the lubricant can be a perfluoropolyether with molecular weight of from 500 to 5000. The lubricant can also be a perfluorinated hydrocarbon having 30 carbons or less, such as an alkane, an amine, an alcohol, an ether, atriazine, or a glycols. Other suitable lubricants are also applicable. The lubricant may be mixed with other materials, such as a diluent to form a lubricant solution. The diluent is preferably chemically stable at a temperature of 200° C. or higher. An exemplary diluent is a perfluorinated hydrocarbon having 20 carbons or less.

The spatial light modulator may be operated in an environment having unexpected gases, moisture or particles (e.g. due to package leaks) which may degrade the performance of the spatial light modulator or cause device failure. This problem can be solved by providing a getter (or getters) to the spatial light modulator for absorbing the gases, moisture, and/or the particles in the environment in which the micromirrors of the spatial light modulator are operated.

The lubricant (or the lubricant solution) for lubricating the surfaces of the micromirrors and the getter(s) for absorbing the gases, moisture, and particles can be disposed at any desired location in the spatial light modulator. As an example of the invention, the lubricant and the getter are disposed on the substrate on which the deflectable elements (e.g. the micromirrors of the spatial light modulator) of the microelectromechanical devices are formed; and the lubricant material can be disposed on either or both sides of the substrate.

The lubricant material can be disposed on the substrate in any desired form. For example, the lubricant material on the substrate may form a ring as shown in the figure. Alternatively, the lubricant on the substrate can be provided as strips or discontinuous segments with a gap in between.

The getter material can be deposited on the substrate on which the deflectable elements are formed in the same way as the lubricant. Specifically, the getter material can be deposited on either surface of the substrate and around the circumference of the substrate either continuously or discontinuously. Selected getter material (e.g. if in black color)

may also be employed for absorbing scattered light from the edges of the micromirror device, in which situation the getter material can be disposed around the periphery of the micromirror array.

Figure 14:
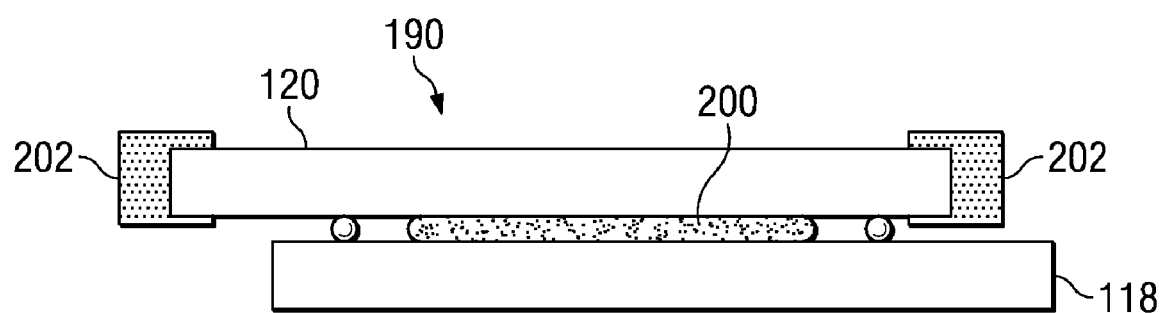
FIG. 14 illustrates a cross-section view of a micromirror array device having lubricants and/or getters disposed on a substrate of the micromirror array device.

Referring to FIG. 14, glass substrate 120 on which the micromirrors are formed is bonded to semiconductor substrate 1118 having thereon electrodes and circuitry via bonding material 200. Lubricant and/or getter material 202 are disposed around the circumference of the glass substrate. The lubricant and/or the getter materials may cover the upper (and/or the lower) surface area around the circumference of the glass substrate, and/or the side-walls of the glass substrate.

For improving transmission of the visible incident light through the substrate having the micromirrors, an anti-reflection coating can be formed on a surface of the substrate having the micromirrors.

Micromirror Array Device Package

The micromirrors, and micromirror array devices are generally sensitive to contamination, such as moisture and dust. This contamination has varying effects on the micromirrors, from capillary-condensation and post-release stiction to deterioration of the micromirror surfaces. Such effects can cause mechanical failure of the micromirrors in operation. For this and other reasons, micromirror array devices are often packaged after releasing. Regardless of differences of the packaging methods currently developed for a micromirror array device, two substrates, one for supporting the device and another one for covering the device, and sealing medium(s) for bonding the two substrates are utilized. Most of the sealing mediums require application of heat during bonding. However, the heat, if not properly applied, may degrade the micromirror array device. For example, improperly applied heat may change the desired mechanical properties of the micromirrors. It may also thermally activate particles, such as impurities and particles making up the micromirrors, prompting diffusion of these activated particles within the micromirrors, thus exacerbating degradation of the micromirrors. Or heat may decrease anti-stiction materials within the package.

In order to package the micromirror device, a first and second substrate can be provided. The micromirror array device is accommodated within a cavity formed by the first and second substrate. During packaging, one or more sealing mediums that are applied between the first and second substrate are soldered by at least a heater that is formed along the periphery of the surface of either the first or the second substrate and embedded underneath said surface of said substrate. The first and the second substrates are then bonded through the soldered sealing mediums as set forth in U.S. patent application Ser. No. 10/443,318, filed May 22, 2003, the subject matter being incorporated herein by reference.

Figure 11:
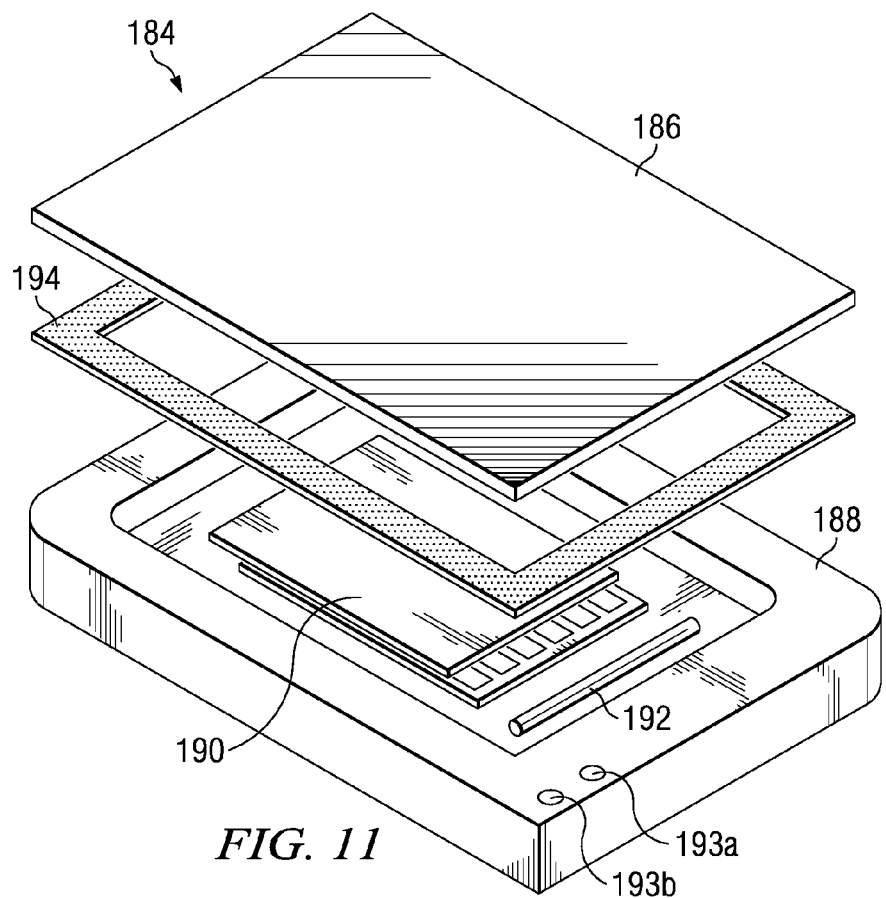
FIG. 11 illustrates a micromirror array device in a package.

FIG. 11 illustrates a perspective view of a micromirror array device package according to an embodiment of the invention. Micromirror array device 190 is paced in the cavity of packaging substrate 188, which comprises an integral heater that is placed underneath the surface of the package substrate. Cover substrate 186, which is preferably glass, is provided for sealing the micromirror array device within the cavity. In order to bond cover substrate 186 and packaging substrate 188 together, sealing medium 194, preferably one that forms a hermetic seal and has a melting temperature of 300° C. or less, and preferably 200° C. or less, is disposed between the cover substrate and packaging substrate. Preferably the sealing material is an inorganic material such as a metal, metal alloy or metal compounds (e.g. a metal or metalloid oxide). Alternatively, the sealing medium layer can also be deposited directly on the surface of the packaging substrate, or on the surface of the lower surface of the cover substrate, in which case, the sealing medium layer is preferably deposited along the periphery of the lower surface of the cover substrate. The sealing medium is preferably a material that is stable, reliable, cost-effective and has good thermal-properties (e.g. co-efficient of thermal expansion (CET), thermal-conductivity etc.) compatible with the other components, such as the package substrate and cover substrate, of the micromirror array device package. It is further preferred that sealing medium has a low melting temperature (when the sealing medium is non-metallic) or soldering temperature (when the sealing medium is metallic). Glass frit, such as Kyocera KC-700, is an acceptable candidate for the sealing medium.

During the bonding process, an electric current is driven through the integral heater via the two heater leads (i.e. leads 193a and 193b) for generating heat. The amplitude of the electric voltage is dominated by electric characteristics of the heater (e.g. electric properties of the material of the heater, the shape of the heater), thermal characteristics and geometry of the substrate layers of the packaging substrate and the desired temperature on the surface of the packaging substrate for melting sealing medium (e.g. sealing medium layer 230). As an example, the melting temperature, also the desired temperature on the surface of the packaging substrate, of the sealing medium is from 100 to 300° C., preferably around 350° C. The heater is embedded underneath the surface of the packaging substrate at a distance preferably from 1 millimeter to 10 millimeters, preferably around 7 millimeters. In this example, the packaging substrate is ceramic. Then the voltage set up between the two heater leads is preferably from 40 to 100 volts, preferably around 70 volts. In other words, this voltage causes the heater generating heat with an amount that raises the surface temperature of the packaging substrate to the melting temperature of the sealing medium layer. As a result, sealing medium is melted and used to bond the cover substrate and packaging substrate. Meanwhile, the temperature at the micromirror device location is far less than the temperature that causes mechanical failure of the micromirrors of the micromirror device. In the embodiment of the invention, the temperature at the micromirror device location is preferably less than 70° C.

Though cover substrate 186 it is preferably visible light transparent glass, it may also be other materials, such as metals or materials that are not transparent to visible light. In these cases, the cover substrate preferably comprises an inlay light transparent glass for allowing light to travel through and shine on the micromirror array device. Alternatively, the cover substrate may have an opening forming window with a light transparent glass mounted on the window for allowing transmission of incident light. Moreover, a light blocking mask with light blocking strips formed around the circumference of the mask may be applied along the cover substrate for blocking incident light not shining on the surface of the micromirror array device. By this, optical performance, such as contrast ratio, of the micromirror array device can be improved.

Other than using glass frit as sealing medium, other suitable materials, such as solderable metallic materials, such as Au, $BiSn_x$, $AuSn_x$, $InAg_x$, $PbSn_x$, and copper, may also be used. However, most solderable metallic materials have poor adhesion to oxide materials or layers that often form on surfaces of the substrates. To solve this problem, a metallization film is preferably employed to metalizing the surface of the substrate before using solderable metallic sealing mediums. For example, a metallization medium can be deposited on the surface of the packaging substrate, before bonding the cover substrate and packaging substrate together. Alternatively, another metallization medium can be deposited on the lower surface of the cover substrate for enhancing the adhesion of the cover substrate to the sealing medium, which is not shown in the figure.

Figure 12:
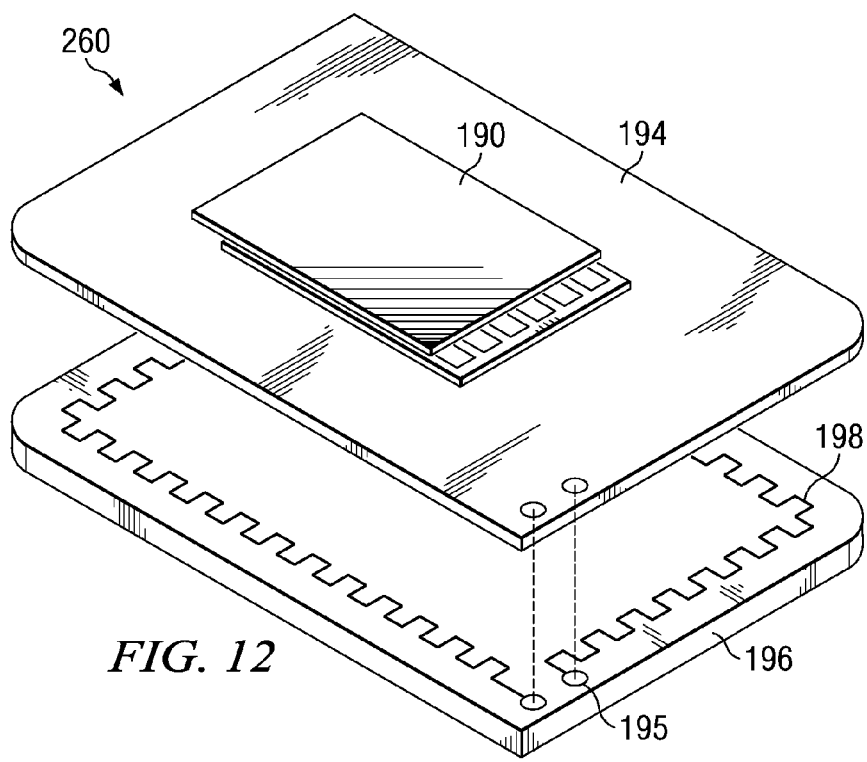
FIG. 12 illustrates a perspective view of a package substrate for use in the micromirror array device package in FIG. 11.

Alternatively, the substrate layers can be flat plates, as shown in FIG. 12. Referring to FIG. 12, substrate layers 196 and 194 of the package substrate both are flat plates. Integral heater 198, which is formed on substrate layer 196 and along the periphery of the surface of the substrate layer, is laminated between substrate layers 196 and 194. Leads 195 are provided for application of electric current through the heater.

Substrate layers 196 and 194 can be any suitable non-electrically conducting materials, preferably ceramic and glass, and more preferably ceramic. In another embodiment of the invention, substrate layers 196 and 194 each can be a multilayered structure that further comprises a plurality of substrate layers. In this situation, the top layer, on which the heater is disposed, of substrate 196 and the bottom layer, which faces the heater, of the substrate are preferably non-electrically conducting layers. Other layers, including the substrate layers underneath the top layer of substrate 196 and the substrate layers above the bottom layer of substrate 194 can be any desired materials, such as ceramic, glass and metallic materials. Micromirror array device 190 can be attached to substrate layer 194 and supported thereby.

Figure 13:
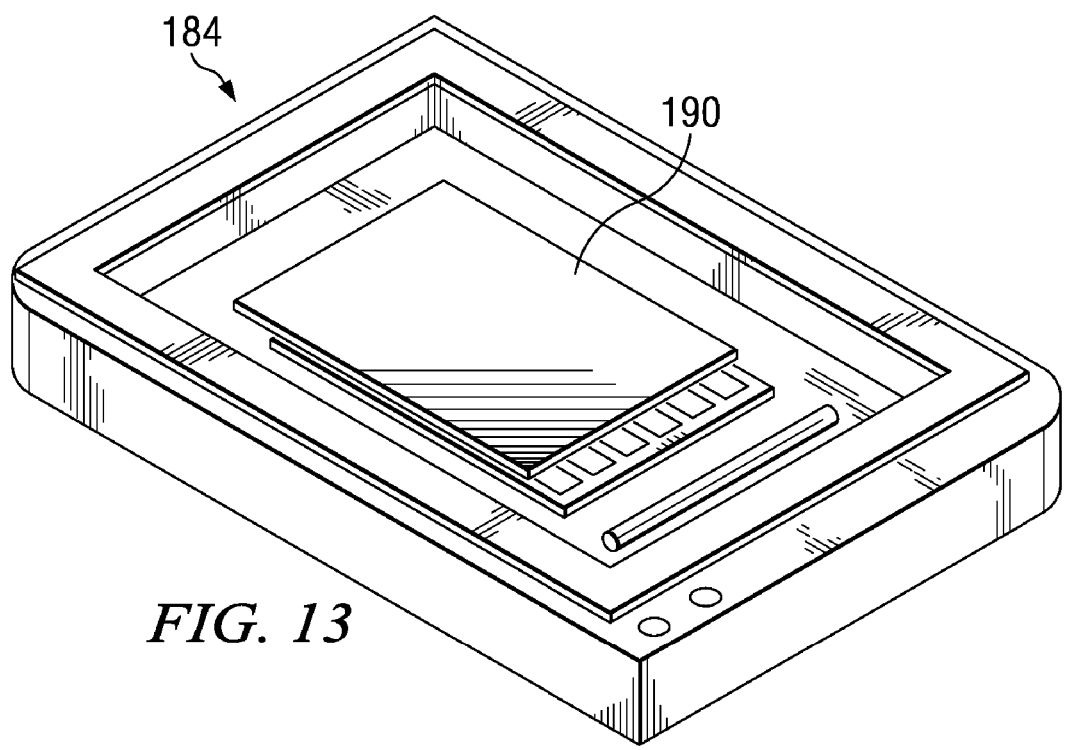
FIG. 13 illustrates a packaged micromirror array device.

FIG. 13 demonstratively illustrates therein a packaged micromirror array device of FIG. 11. Also shown in the figure is a light blocking coating around the parameters of the glass substrate for blocking light incident onto the parameter of the package and blocking the undesired scattered light from the components other than the reflective mirror plates of the micromirrors.

In accordance with another embodiment of the invention, the cover substrate that is transmissive to visible light can be positioned at an angle relative to the packaging substrate. The angle can be from 0.2° to 5° degrees. Or the angle depends upon the reflection index of the cover substrate to visible light.

Figure 15A:
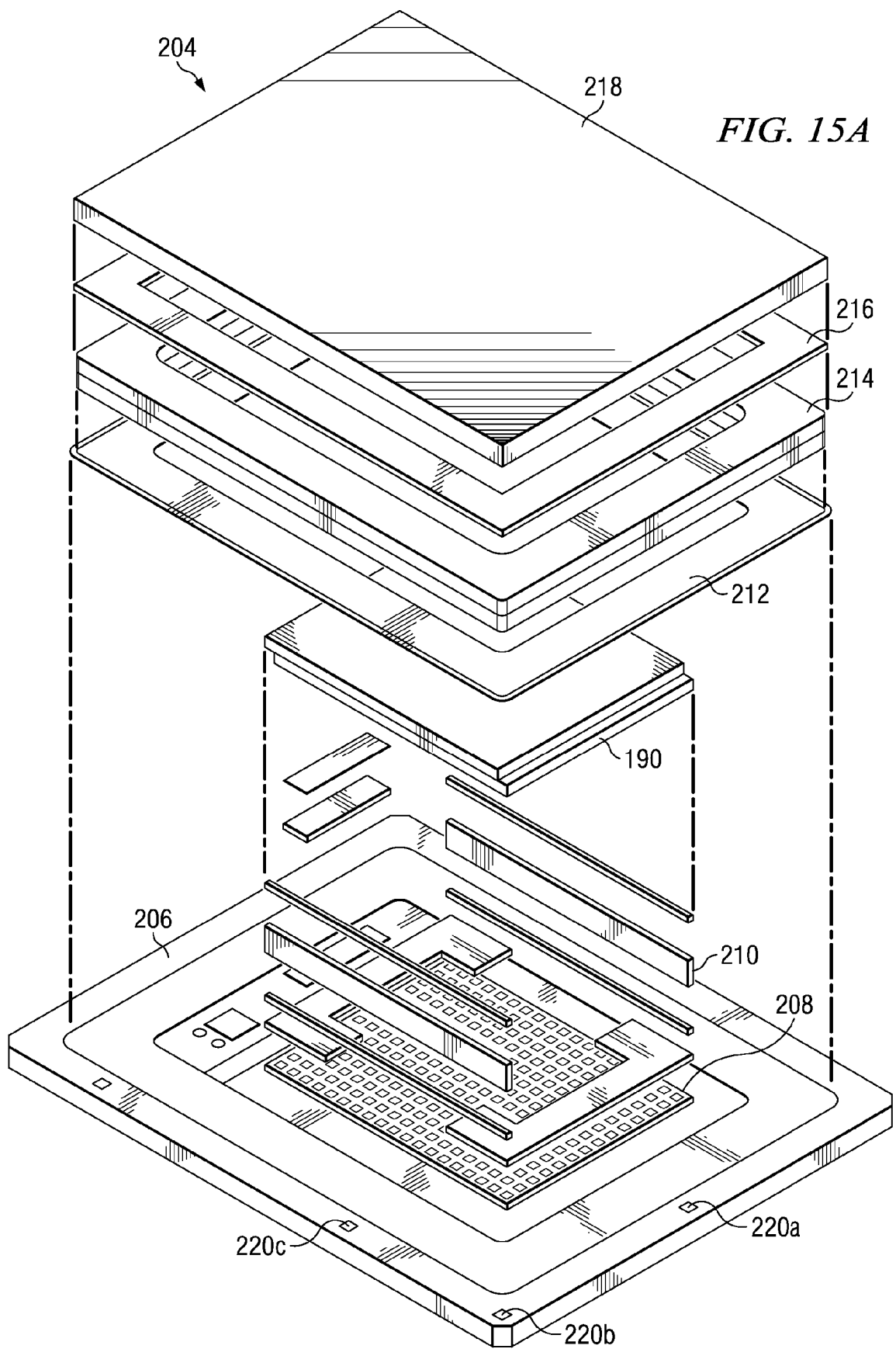
FIGS. 15a to 15c are perspective views of alternative packages for use in packaging a micromirror array device.
Figure 15B:
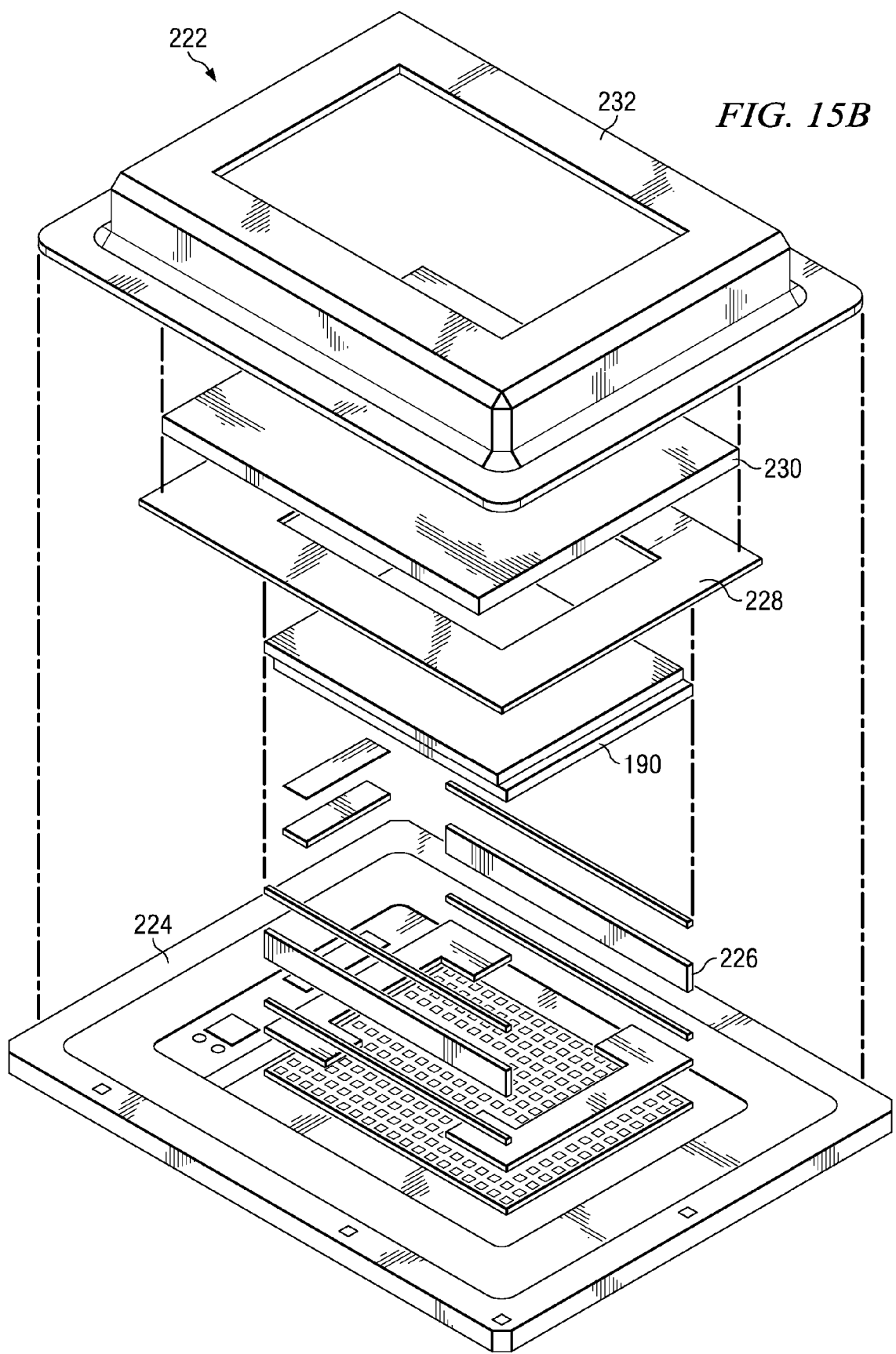
Figure 15C:
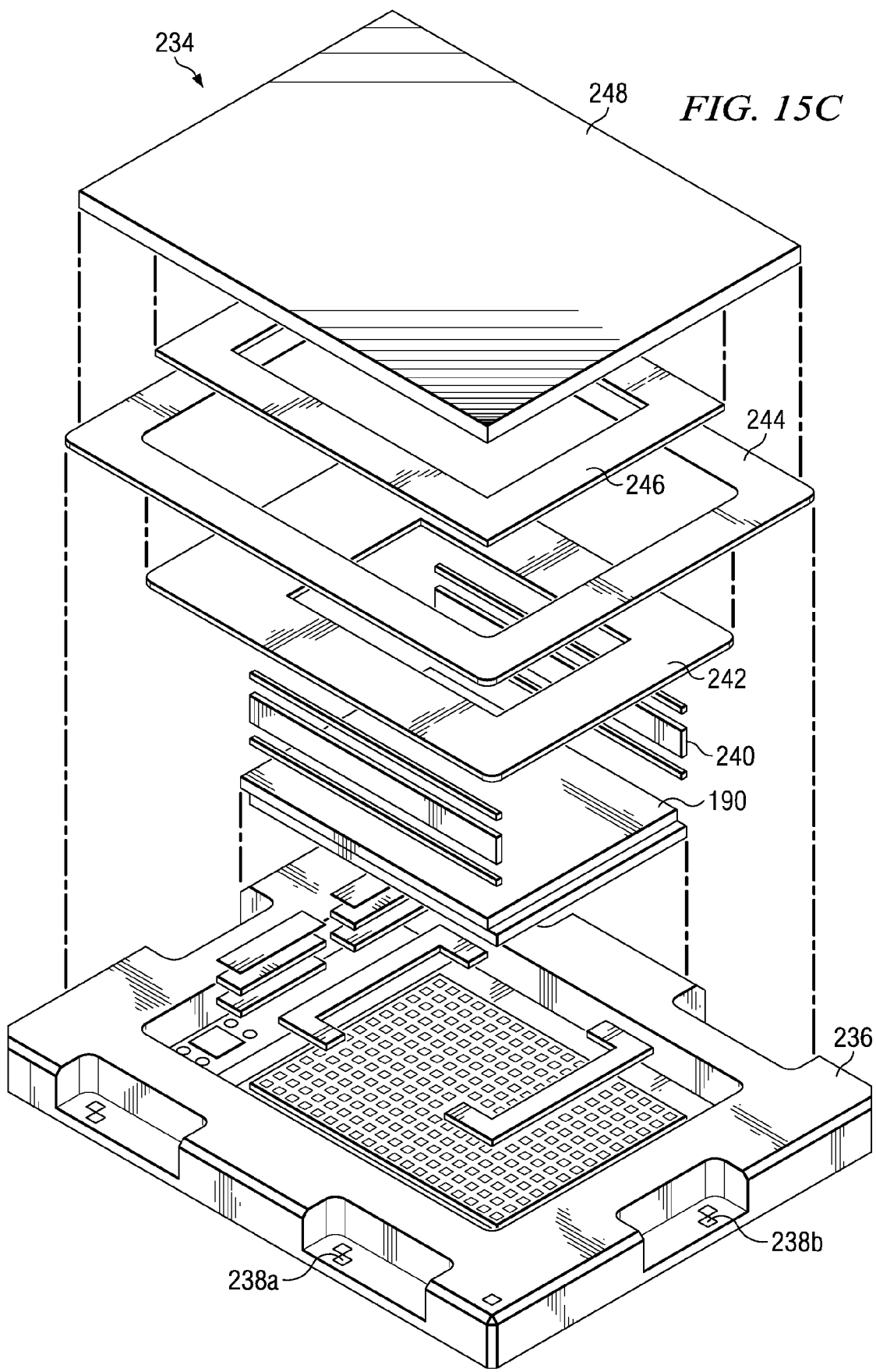

FIGS. 15a to 15c presented therein other non-exclusive exemplary micromirror array device packages. Referring to FIG. 15a, micromirror array device 190 is attached to package substrate 206. For aligning the micromirror array device to the package substrate, alignment marks 220a, 220b, and 220c can be formed on the extending edge of the package substrate as shown in the figure. Spacer 214 is positioned between the package substrate and cover lid 204 that is preferably transmissive to visible light for maintaining a constant distance between the package substrate and cover lid. The distance between the cover lid and the package substrate can be further fixed by spacer 210 that is positioned around the micromirror array device as shown in the figure.

For bonding the cover lid, spacer 214, and the packaging substrate together, sealing mediums 216 and 212 are provided. Specifically, sealing medium 216 is positioned between the cover lid and spacer 214, while sealing medium 212 is positioned between spacer 214 and the packaging substrate. The sealing medium can be the same as sealing material 194 in FIG. 11. Alternatively, when the sealing material is metallic, a metallization medium can be provided for the surfaces of the cover lid and packing substrate, as discussed with reference to FIG. 11.

FIG. 5b illustrates therein components of a micromirror array device package before bonding. In this particular example, package 222 comprises packaging substrate 224 having optional features of alignment marks. Unlike the package as discussed in FIG. 15a, cover lid 232 in package 222 in FIG. 5b is formed as a cap with one surface being extended outwardly. The cover lid is preferably a metal with an inlay transmissive window around the center allowing for transmission of visible light.

FIG. 5c illustrates therein components of a micromirror array device package before bonding. Unlike the package as discussed in FIGS. 15a and 15b, package substrate 236 to which the micromirror array device is attached to comprises a set of alignment marks formed on exposed surfaces of pits that are formed on the extended edges of the package substrate.

FIG. 16 illustrates another micromirror array device package according to yet another embodiment of the invention. Micromirror array device package 250 comprises package substrate 256 that is preferably flat. Package cover 152 having a cavity is bonded to the package. Micromirror array device 190 is positioned and sealed within the cavity formed by the package substrate and package cover. As an alternative feature, beads 254 are disposed between the lower substrate of the micromirror array device and package substrate. The beads is provided for releasing deformation of the micromirror array device substrates; and also for dissipating heat produced by the micromirror array device in operation. For this reason, it is preferred that the beads has a coefficient of Thermo-Expansion that matches the CTE of the lower substrate of the micromirror array device and the package substrate. Other than the beads, a substrate insert can be employed for the same purposes. The substrate insert can be disposed between the micromirror array device and the package substrate, which will not be discussed in detail herein.

Fabrication Processes

The micromirror array device as discussed above can be fabricated in many ways. An exemplar fabrication process will be discussed in the following with reference to FIGS. 17 to 25. It will be appreciated by those skilled in the art that the following discussion is for demonstration purposes, and will not be interpreted as a limitation. Instead, any variations without departing from the spirit of the invention are also applicable. Specifically, the fabrications of the micromirror array device (including the following step of removing the sacrificial layers, assembling, packaging) can be performed in a die level with each dies comprising an array of micromirrors. Alternatively, they can be performed on a wafer level with each wafer comprising a plurality of dies each of which further comprises an array of micromirrors.

Referring to FIG. 17, a flow chart presenting the steps executed for fabricating a micromirror array device is illustrated therein. For simplicity purposes without losing the generality, the fabrication process for the micromirror array device will be discussed with reference to fabrication of one micromirror of the micromirror array. The fabrication starts from formation of the structure members of the micromirror (step 260). As a way of example, FIGS. 18a to 18c illustrate cross-section views of the micromirror during the exemplary fabrication.

Figure 18A:
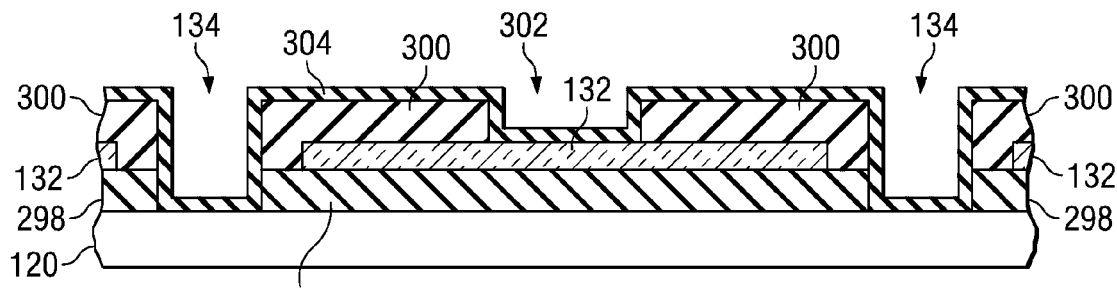
FIG. 18a to FIG. 18c are cross-section views of a micromirror during an exemplary fabrication process.
Figure 18B:
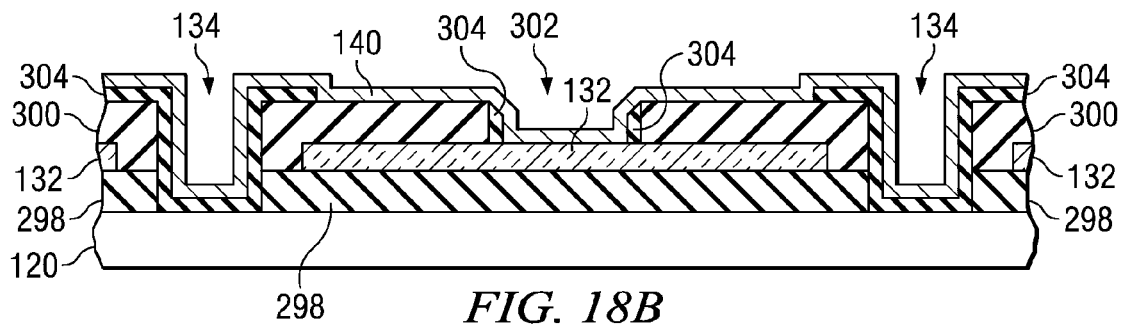
Figure 18C:
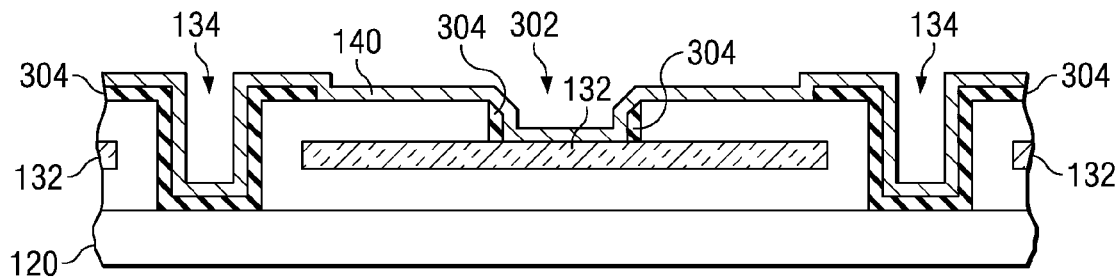

Referring to FIG. 18A, substrate 120 is provided. First sacrificial layer 298 is deposited on the substrate followed by the deposition of micromirror plate layer 132. The substrate can be a glass (e.g. 1737F, Eagle 2000), quartz, Pyrex™, sapphire. The substrate may also be a semiconductor substrate (e.g. silicon substrate) with one or more actuation electrodes and/or control circuitry (e.g. CMOS type DRAM) formed thereon.

First sacrificial layer 298 may be any suitable material, such as amorphous silicon, or could alternatively be a polymer or polyimide, or even polysilicon, silicon nitride, silicon dioxide, etc. depending upon the choice of sacrificial materials, and the etchant selected. If the first sacrificial layer is amorphous silicon, it can be deposited at 300-350° C. The thickness of the first sacrificial layer can be wide ranging depending upon the micromirror size and desired title angle of the micro-micromirror, though a thickness of from 500 Å to 50,000 Å, preferably around 10,000 Å, is preferred. The first sacrificial layer may be deposited on the substrate using any suitable method, such as LPCVD or PECVD.

As an optional feature of the embodiment, an anti-reflection layer (not shown in the figure) maybe deposited on the surface of the substrate. The anti-reflection layer is deposited for reducing the reflection of the incident light from the surface of the substrate. Alternatively, other optical enhancing layers may be deposited on either surface of the glass substrate as desired.

After depositing the first sacrificial layer, a plurality of structure layers will be deposited and patterned as appropriate. According to the invention, a structural layer is a layer that will not be removed after the removal of the sacrificial layers. The first structural layer deposited on the first sacrificial layer is micromirror plate layer 132 for forming a mirror plate. Because the micromirror is designated for reflecting incident light in the spectrum of interest (e.g. visible light spectrum), it is preferred that the micromirror plate layer comprises of one or more materials that exhibit high reflectivity (preferably 90% or higher) to the incident light. According to the embodiment of the invention, the mirror plate layer is preferably a multi-layered structure comprising a top and bottom protection layer for protecting the interior layers. In the preferred embodiment of the invention, the top and bottom protection layers can be $SiO_x$ with a preferred thickness of 400 Å. Of course, other suitable materials may also be employed herein. The interior layers comprises a light reflecting layer and an enhancing layer. The light reflecting layer may comprise one or more materials exhibiting high light reflectivity. Examples of such materials are Al, Ti, gold, silver, AlSiCu or TiAl. In the preferred embodiment of the invention, the light reflecting layer is aluminum with a thickness of 2500 Å. This aluminum layer is preferred to be deposited at 150° C. or other temperatures preferably less than 400° C. The enhancing layer preferably comprises of metal or metal alloy for enhancing the electric and mechanical properties of the micromirror plate. An example of such enhancing layer is titanium with a thickness of 80 Å. Of course, other suitable materials having high reflectivity to the incident light of interest may also be adopted for the micromirror plate. In depositing the micromirror plate layer, PVD is preferably used at 150° C. The thickness of the micromirror plate layer can be wide ranging depending upon the desired mechanical (e.g. elastic module), the size of the micromirror, desired titled angle and electronic (e.g. conductivity) properties of the micromirror plate and the properties of the materials selected for forming the micromirror plate. According to the invention, a thickness of from 500 Å to 50,000 Å, preferably around 2500 Å, is preferred.

The mirror plate layer is then patterned into a desired shape, as shown in FIGS. 5 and 6. The mirror can be of any shape as desired. The patterning of the micromirror can be achieved using standard photoresist patterning followed by etching using, for example CF4, C12, or other suitable etchant depending upon the specific material of the micromirror plate layer.

After the formation of the micromirror plate, second sacrificial layer 300 is deposited on the mirror plate and first sacrificial layer. Second sacrificial layer 300 may comprise amorphous silicon, or could alternatively comprise one or more of the various materials mentioned above in reference to the first sacrificial layer. First and second sacrificial layers need not be the same, though are the same in the preferred embodiment so that, in the future, the etching process for removing these sacrificial layers can be simplified. Similar to the first sacrificial layer, the second sacrificial layer may be deposited using any suitable method, such as LPCVD or PECVD. If the second sacrificial layer comprises amorphous silicon, the layer can be deposited at 350° C. The thickness of the second sacrificial layer can be on the order of 9000 Å, but may be adjusted to any reasonable thickness, such as between 2000 Å and 20,000 Å depending upon the desired distance (in the direction perpendicular to the micromirror plate and the substrate) between the micromirror plate and the hinge. It is preferred that the hinge and mirror plate be separated by a gap after release of at least 0.5 um (this can be at least 1 um or even 2 um or more if desired). The second sacrificial layer may also fill in the trenches left from the patterning of the micromirror plate.

In the preferred embodiment of the invention, the mirror plate layer comprises an aluminum layer, and the second sacrificial layer is silicon. This design, however, can cause defects in the hinge-structure due to the diffusion of the aluminum and silicon at the edges of the micromirror plate, wherein the aluminum is exposed to the silicon. To solve this problem, a protection layer (not shown) maybe deposited on the patterned micromirror plate before depositing the second sacrificial silicon layer such that the aluminum layer can be isolated from the silicon sacrificial layer. Then the protection layer is patterned according to the shape of the micromirror plate. After the patterning, segments of the protection layer cover the edges of the micromirror plate for isolating the aluminum and the silicon sacrificial layer.

The deposited first and second sacrificial layers are patterned afterwards so as to form hinge contact 302 and post 134 as appropriate. Because a micromirror in the micromirror array may have only one post, or may even have no post, posts 134 are thus formed accordingly. Patterning of the sacrificial layers can be performed using standard lithography technique followed by etching. The etching step may be performed using $Cl_2$, $BCl_3$, or other suitable etchant depending upon the specific material(s) of the second sacrificial layer. The distance across the two posts depends upon the length of the defined diagonal of the micromirror plate. In an embodiment of the invention, the distance across the two deep-via areas after the patterning is preferably around 10 μm, but can be any suitable distance as desired. In order to form the hinge contact, an etching step using $CF_4$ or other suitable etchant may be executed. The shallow-via area, which can be of any suitable size, is preferably on the order of 2.2 μm on a side.

On the patterned first and second sacrificial layers, hinge-support layer 304 is deposited. Because the hinge-support layer is designated for holding the hinge (e.g. hinge 140 in FIG. 5) and the mirror plate (e.g. mirror plate 132 in FIG. 5) attached thereto such that the micromirror plate can pivot along the hinge, it is desired that the hinge support layers comprise of materials having at least large elastic modulus. According to an embodiment of the invention, the hinge support layer comprises a 400 Å thickness of $TiN_x$ (although it may comprise $TiN_x$, and may have a thickness between 100 Å and 2000 Å) layer deposited by PVD, and a 3500 Å thickness of $SiN_x$ (although the thickness of the SiNx layer may be between 2000 Å and 10,000 Å) layer deposited by PECVD. Of course, other suitable materials and methods of deposition may be used (e.g. methods, such as LPCVD or sputtering). The $TiN_x$ layer is not necessary for the invention, but provides a conductive contact surface between the micromirror and the hinge in order to, at least, reduce charge-induced stiction.

After the deposition, layer 304 is patterned into a desired configuration (e.g. hinge support 136 in FIG. 5), as shown in FIG. 18*b*. The mirror stops, such as the mirror stops (e.g. mirror stops 142 in FIG. 5) corresponding to the "ON" state and/or mirror stops (not shown) corresponding to the "OFF" state can also be configured. An etching step using one or more proper etchants is then performed afterwards. In particular, the layers can be etched with a chlorine chemistry or a fluorine chemistry where the etchant is a perfluorocarbon or hydrofluorocarbon (or $SF_6$) that is energized so as to selectively etch the hinge support layers both chemically and physically (e.g. a plasma/RIE etch with $CF_4$, $CHF_3$, $C_3F_8$, $CH_2F_2$, $C_2F_6$, $SF_6$, etc. or more likely combinations of the above or with additional gases, such as $CF_4/H_2$, $SF_6/Cl_2$, or gases using more than one etching species such as $CF_2Cl_2$, all possibly with one or more optional inert diluents). Different etchants may, of course, be employed for etching each hinge support layer (e.g. chlorine chemistry for a metal layer, hydrocarbon or fluorocarbon (or $SF_6$) plasma for silicon or silicon compound layers, etc.). Alternatively, the etching step can be performed after deposition of each hinge support layer.

After etching the hinge support layer, posts 134 and hinge contact 302 are formed. The bottom segment of the hinge contact is removed by etching and the part of the mirror plate underneath the contact area is thus exposed. The exposed part of mirror plate will be used to form an electric-contact with external electric source. The sidewalls of the hinge contact are left with residues of the hinge support layer after etching. The residue on the sidewalls helps to enhance the mechanical and electrical properties of the hinge that will be formed afterwards. In an embodiment of the invention, the hinge supports of the adjacent micromirrors can form a continuous member. The formation of the hinge supports of the micromirrors in the micromirror array is thus performed accordingly.

After the completion of patterning and etching of the hinge support layer, hinge layer 140 is deposited and then patterned as shown in FIG. 18*b*. Because the hinge provides a rotation axis for the micromirror plate, it is natural to expect that the hinge layer comprises a material that is at least susceptible to plastic deformation (e.g. fatigue, creep, and dislocation motion). Furthermore, when the hinge layer is also used as electric contact for the micromirror plate, it is desired that the material of the hinge layer is electrically conductive. Examples of suitable materials for the hinge layer are silicon nitride, silicon oxide, silicon carbide, polysilicon, Al, Ir, titanium, titanium nitride, titanium oxide(s), titanium carbide, $CoSiN_x$, $TiSiN_x$, $TaSiN_x$, or other ternary and higher compounds. When titanium is selected for the hinge layer, it can be deposited at 100° C. Alternatively, the hinge layer may comprise of multi-layers, such as 100 Å $TiN_x$ and 400 Å $SiN_x$.

After deposition, the hinge layer is then patterned as desired using etching. Similar to the hinge support layer, the hinge layer can be etched with a chlorine chemistry or a fluorine chemistry where the etchant is a perfluorocarbon or hydrofluorocarbon (or $SF_6$) that is energized so as to selectively etch the hinge layers both chemically and physically (e.g. a plasma/RIE etch with $CF_4$, $CHF_3$, $C_3F_8$, $CH_2F_2$, $C_2F_6$, $SF_6$, etc. or more likely combinations of the above or with additional gases, such as $CF_4/H_2$, $SF_6/Cl_2$, or gases using more than one etching species such as $CF_2Cl_2$, all possibly with one or more optional inert diluents). Different etchants may, of course, be employed for etching each hinge layer (e.g. chlorine chemistry for a metal layer, hydrocarbon or fluorocarbon (or $SF_6$) plasma for silicon or silicon compound layers, etc.).

Structure Materials

In addition to the structure materials introduced above, structures of the micromirrors may be composed of: elemental metals or metalloid (not Si, and Ge), metal alloys, metal compounds, that comprises two or more elemental metals, intermetallic compounds, and ceramics (but not WN).

The elemental metals can be Al, Au, Ti, Ir, Au, Ag, Ta, Mo, Pt, or Cu, or other metals that are preferably etchable with vapor phase noble gas halides or interhalogens. The metal alloys can be $WTi_x$, $WMo_x$, or $WTa_x$ or other suitable materials.

The metallic compounds may be metal silicides, such as $AlSi_x$, $WSi_x$, $MoSi_x$, $TiSi_x$, $ZrSi_x$, $CrSi_x$, $TaSi_x$, $AlSi_xCu_y$, and $TiW_xSi_y$), or ceramic materials (e.g. silicon nitride, silicon carbide, polysilicon, titanium nitride, titanium oxide(s), titanium carbide, $CoSi_xN_y$, $TiSi_xN_y$, $TaSi_xN_y$, or other ternary and higher compounds).

The intermetallic compound can be $Ti_xAl_y$, $Ni_xAl_y$, $Ti_xNi_y$, $VAl_x$, $WTe_x$, $TiFe_x$, $TiPd_x$, $AlPd_x$, $MoPd_x$, $MoNi_x$, $MoFe_x$, $CoCr_x$, $CoMn_x$, $NiW_x$, $NiV_x$, $NiTi_xAl_y$, $NbAl_x$, $MoPd_x$, $AlCu_x$, $CuZn_x$, and $TaAl_x$. The intermetallic compound may be composed of a transition metal, especially an early transition metal. The early transition metals are those elements in the periodic table in columns 3 through 7, namely columns beginning with Sc, Ti, V, Cr, and Mn. Preferred are those elements in columns 4 through 6 (i.e. Ti, Zr, Hf, V, Nb, Ta, Cr, Mo, and W), and elements Tc and Re in column 7. However late transition metals in columns 8, 9 and 10 (e.g. Ru, Os, Rh, Ir, and Pt) may also be possible in the present invention. Other structural materials may comprise materials that are predominantly intermetallic compounds that are further strengthened by addition of one or more strengthen materials, such as O and N. In this situation, the structural material comprises at least 60 atomic % or more, or 80 atomic % or more, or 90 atomic % or more, or 95 atomic % or more of the intermetallic material.

A ceramic is a compound wherein a metal (or metalloid) is bounded to a non-metal. The ceramics for the microstructures comprise transition metal nitride (e.g. $TiN_x$, $TaN_x$ and $CrN_x$), transition metal oxide (e.g. $TiO_x$, $TaO_x$ and $CrO_x$), transition metal carbide (e.g. $WC_x$, $TiC_x$, $TaC_x$ and $CrC_x$), transition metal oxynitride (e.g. $TiO_xN_y$, and $TaO_xN_y$), transition metal silicon nitride (e.g. $TiSi_xN_y$, and $TaSi_xN_y$), transition metal silicon oxynitride (e.g. $TiSiO_xN_y$, and $TaSiO_xN_y$), metalloid nitride (e.g. $SiN_x$), metalloid oxide (e.g. $SiO_x$), metalloid carbide (e.g. $SiC_x$), metalloid oxynitride (e.g. $SiO_xN_y$) or other ternary and higher compounds.

Sacrificial Materials and Barrier Layer Materials

In fabricating the structures of the micromirrors on the substrate, sacrificial materials, such as amorphous silicon, W and other suitable materials are used. When amorphous silicon is used as the sacrificial layer and deposited between structural layers, it may diffuse into some structural layers, such as aluminum. To avoid such diffusion, a barrier layer may be deposited between the sacrificial layer and the structural layers (e.g. aluminum layer) that suffer from diffusion of silicon. The barrier layers can be a layer to be removed with the sacrificial layers or a layer stays with the structure layers after removal of sacrificial materials.

In addition to amorphous silicon, the sacrificial material for the sacrificial layers can be selected from the group consisting of elemental early transition metal, metal alloy, metalloid, metal silicide and other suitable materials such as $WN_x$ and $TaN_x$. Preferred early transition metals are those elements in columns 4 through 6 (i.e. Ti, Zr, Hf, V, Nb, Ta, Cr, Mo and W). Exemplary metal alloys for the sacrificial layers are $W_xTa$, $W_xTi$, $W_xMo$ and $W_xCr$. Exemplary metalloids for the sacrificial layers are Si, Ge and SiGe. Exemplary metal silicides for the sacrificial layers are $WSi_x$, $TiSi_x$, $MoSi_x$, $ZrSi_x$, $CrSi_x$, $TaSi_x$, and $TiWSi_x$. Most preferred materials are Ti, Si, W, WN and compounds or alloys thereof.

XeF2 Etching Technique

After all structural members of the micromirrors in the micromirror array are formed, the first and second sacrificial layers are then removed with chemical etching (step 262 in FIG. 17). In accordance with an embodiment of the invention, the etching utilizes an etchant gas capable of spontaneous chemical etching of the sacrificial material, preferably isotropic etching that chemically (and not physically) removes the sacrificial material.

Chemical Etchants

Preferred etchants for the release etch are gaseous fluoride etchants that, except for the optional application of temperature, are not energized or non-plasma. Of course, energized and plasma etchants are also applicable, especially in the early stage of the etching process which requires low selectivity, which will be discussed afterwards.

Examples include HF gas, noble gas halides, and interhalogens. The noble gases are helium, neon, argon, krypton, xenon and radon, and among these the preferred fluorides are fluorides of krypton and xenon, with xenon fluorides the most preferred. Common fluorides of these elements are krypton difluoride, xenon difluoride, xenon tetrafluoride, and xenon hexafluoride. The most commonly used noble gas fluoride in silicon etch procedures is xenon difluoride. Halogen fluorides include bromine fluoride, bromine trifluoride, bromine pentafluoride, chlorine fluoride, chlorine trifluoride, chlorine pentafluoride, iodine pentafluoride and iodine heptafluoride. Preferred among these are bromine trifluoride, bromine trichloride, and iodine pentafluoride, with bromine trifluoride and chlorine trifluoride the more preferred. Combinations of bromine trifluoride and xenon difluoride are also of interest.

In addition to the above etchants, there are others that may also be used by themselves or in combination. Some of these include wet etches, such as ACT, KOH, TMAH, HF (liquid); oxygen plasma, $SCCO_2$, or super critical $CO_2$ (the use of super critical $CO_2$ as an etchant is described in U.S. patent application Ser. No. 10/167,272, which is incorporated herein by reference). Of course, the etchants and methods selected should be matched to the sacrificial materials being removed and the desired materials being left behind.

Etchant Additives

In performing the etching, the selected chemical etchant is preferably mixed with one or more gaseous additives to increase the selectivity. The gaseous additive is preferably a gas that is not itself active as an etching agent, and preferably a non-halogen-containing gas. The additive may be a single species or a mixture of species. In preferred embodiments of this invention, the additives are those whose molar-averaged formula weight (expressed in daltons or grams per mole) is less than the formula weight of molecular nitrogen, preferably about 25 or less, still more preferably within the range of from about 4 to about 25, still more preferably within the range of from about 4 to about 20, and most preferably within the range of from about 4 to about 10. If a single additive species is used, the "molar-averaged formula weight" is the actual formula weight of that species, whereas if two or more additive species are used in the same gas mixture, the molar-averaged formula weight is the average of the formula weights of each species in the mixture (exclusive of the noble gas fluoride) calculated on the basis of the relative molar amounts (approximately equal to the partial pressures) of each species. In terms of thermal conductivity, preferred additives are those whose thermal conductivity at 300 K (26.9° C.) and atmospheric pressure ranges from about 10 mW/(m K) (i.e., milliwatts per meter per degree Kelvin) to about 200 mW/(m K), and most preferably from about 140 mW/(m K) to about 190 mW/(m K). In general, the higher the thermal conductivity of the additive, the greater the improvement in selectivity. Examples of additives suitable for use in this invention are nitrogen ($N_2$, formula weight: 28; thermal conductivity at 300 K: 26 mW/(m K)), argon (Ar, formula weight: 40; thermal conductivity at 300 K: 18 mW/(m K)), helium (He, formula weight: 4; thermal conductivity at 300 K: 160 mW/(m K)), neon (Ne, formula weight: 20; thermal conductivity at 300 K: 50 mW/(m K)), and mixtures of two or more of these gases. For embodiments in which the molar-averaged formula weight is below that of molecular nitrogen, the preferred additive gas is helium, neon, mixtures of helium and neon, or mixtures of one or both with one or more of higher formula weight non-etchant gases such as nitrogen and argon. Particularly preferred additives are helium and mixtures of helium with either nitrogen or argon or other inert gas.

The degree of selectivity improvement may vary with molar ratio of the additive to the etchant gas, but this ratio is generally not critical to the utility of this invention. Here again, the molar ratio is approximately equal to the ratio of the partial pressures, and in this case the term "molar ratio" denotes the ratio of the total number of moles of the additive gas (which may be more than one species) divided by the total number of moles of the etchant gas (which may also be more than one species). In most cases, best results will be obtained with a molar ratio of additive to etchant that is less than about 500:1, preferably within the range of from about 1:1 to about 500:1, preferably from about 10:1 to about 200:1, and most preferably from about 20:1 to about 100:1.

Etching Apparatus

Such chemical etching and apparatus for performing such chemical etching are disclosed in U.S. patent application Ser. No. 09/427,841, filed Oct. 26, 1999, Ser. No. 09/649,569, filed Aug. 28, 2000, Ser. No. 10/665,998, filed Sep. 17, 2003, Ser. No. 10/666,671, filed Sep. 17, 2003, Ser. No. 10/666,002, filed Sep. 17, 2003, the subject matter of each being incorporated herein by reference, and will not be discussed in detail herein.

Etching Methods

Breakthrough Etching

In accordance with an embodiment of the invention, the sacrificial material is removed through multiple etching steps including a breakthrough etching (step 280 in FIG. 17). Specifically, the breakthrough etching removes a portion of the material and fully or partially physically removes the material, and where a subsequent etch step (e.g. step 282 in FIG. 17) removes additional material and removes the material chemically but not physically as set forth in U.S. patent application Ser. No. 10/154,150 filed May 22, 2002, the subject matter being incorporated herein by reference.

As a way of example, the breakthrough etching is performed having relatively low selectivity (e.g. less than 200:1, preferably less than 100:1 and more preferably less than 35:1 or even 10:1); and with an energized vapor phase etchant selected from the possible etchants as discussed above, such as fluorides. The energized fluoride gas can be energized with, for example, light (e.g. UV light), an electric field, or other fields or energy to energize the gas beyond its normal energy as a gas at a particular temperature, such as into a plasma state. This energizing of the gas of the invention gives it a physical component to its etching behavior, in addition to a chemical component. Specific examples for energizing the etchant of the first etch include using a pair of parallel plate electrodes disposed in a chamber with a gas, and applying electric power of high frequency to the electrodes so that gas discharging takes place to generate gas plasma. Besides reactive ion etching and plasma etching, there are EDR dry etching methods, ion beam etching methods and photo excited etching methods. The etchant in the breakthrough etching could also be a noble gas which is energized so as to cause a purely physical etch in the first etch (e.g. an Ar or Xe sputter etch). These methods preferably accomplish the initial etch by causing an interaction physically (Ar sputter) or chemically and physically (plasma fluoride compound) between the energized gas and the material to be removed in making the device. The breakthrough etching, therefore, is preferably the result of at least energetic bombardment of the sacrificial material (e.g. by charged species such as positive ions, electrons or negative ions), and possibly additionally a chemical reaction between the etchant gas or gases (e.g. by radicals) and the sacrificial material. Following the breakthrough etching other etching steps with relatively high selectivity can be performed. In other embodiments of the invention, the breakthrough etching may not be required and instead is replaced by other etching methods with high selectivity, which will be discussed afterwards.

One or more additional gases can be mixed with the aforementioned etchants for the breakthrough etch, including one or more of $O_2$, an inert gas such as Xe or Ar, $N_2$, $F_2$, $H_2$, CO, $N_xF_y$ (e.g. $NF_3$), $Si_xF_y$ (e.g. $SiF_4$) or an additional fluorocarbon (with or without a hydrogen component) as above. The exact mixture of gases for the first etch can be optimized for the sacrificial material as known in the art, though it is not necessary that the selectivity be optimized (rather that the primary fluoride containing gas and any additional gases be capable of etching silicon and/or silicon compounds when energized). Regardless of which gas or gases are used in the first energized etch, it is preferred that the first etch not proceed all the way through the thickness of the sacrificial layer. In most cases, the first etch should proceed through 1/4 or less, or preferably 1/10 or less of the total thickness of the sacrificial layer. Also, it is preferred that the etch proceed for less than 20 minutes, and more preferably less than 10 minutes. The preferred etching depth is 500 angstroms or less and preferably less than 250 angstroms. Such limits on the first etch should result in substantially no undercutting (of etch material from under the micromechanical structural material).

Slow Etch

Following the breakthrough etch, or even without the breakthrough etch, a non-energized and non-plasma spontaneous vapor phase etching process is carried out (step 282 in FIG. 17). As a way of example, an etching process with slow etching rate for achieving high selectivity and/or determining an end of the etching reaction can be performed. In one embodiment of the invention, a silicon material is etched at an etch rate of 27.7 um/hr or less, and preferably at an etch rate of 7.2 um/hr or less. The method can also providing a sample to be etched in a chamber; providing a vapor phase etchant to the chamber to etch the sample, the vapor phase etchant capable of etching the sample in a non-energized state. The invention can also include monitoring the gas from the etching chamber; and determining the end point of the etch based on the monitoring of the gas from the etching chamber. Selectivity of the etch can further be improved by doping the silicon material as set forth in U.S. patent application Ser. No. 09/954,864, filed Jun. 17, 2001, the subject matter being incorporated herein by reference.

High Pressure Etching

With the selected gaseous spontaneous etchants, the etching process can be performed under a high pressure, as set forth in U.S. patent application Ser. No. 10/104,109, filed Mar. 22, 2002, the subject matter being incorporated herein by reference. For achieving high selectivity and/or determining an end of the etching reaction, the sacrificial material is removed through chemical etching at a total gas pressure at the etch sight of 10 Torr or more, preferably 20 Torr or more, or even 50, 100 or 200 Torr or more. Other features of the invention, including use of diluents along with the vapor phase etchant, etching slower than 25 or 20 um/hr, recirculating or agitating etching gas during the etch, detecting gas components in order to determine an etch end point, improved selectivity, plasma etching prior to the vapor phase etch, among others, can be included herein.

Etching Process with Discrete Etchant Feeding Scheme

As another way of example, the sacrificial material can be removed using one or more selected spontaneous vapor phase etchants, while the etchants are fed according to discrete time schedule as set forth in U.S. patent application Ser. No. 10/665,998, filed Sep. 17, 2003, the subject matter being incorporated herein by reference. A spontaneous etchant is a chemical etchant such that a chemical reaction between said etchant and a sacrificial material occurs spontaneously and does not require activation energy. And a spontaneous vapor phase etchant is a spontaneous chemical etchant that reacts with the sacrificial material in vapor phase. In the embodiments of the invention, the supply of the etchant to remove the sacrificial materials can be "infinite"—e.g. much larger than the quantity required to completely remove the sacrificial materials. The etchant is fed into the etch chamber containing the microstructure during each feeding cycle of a sequence of feeding cycles until the sacrificial material of the microstructure is exhausted through the chemical reaction between the etchant and the sacrificial material. Specifically, during a first feeding cycle, a first discrete amount of selected spontaneous vapor phase etchant is fed into the etch chamber. At a second feeding cycle, a second discrete amount of the etchant is fed into the etch chamber. The first discrete amount and the second discrete amount of the selected etchant may or may not be the same. This etchant feeding process continues until the sacrificial material of the microstructure is exhausted through the chemical reaction between the etchant and the sacrificial materials. The time duration of the feeding cycles are individually adjustable.

At each feed cycle, the etchant is fed into the etch chamber via an outer circulation loop that passes through the etch chamber and an exchange chamber in which the etchant is prepared. After the feeding, the etchant is circulated via an inner circulation loop that passes through the etch chamber but not the exchange chamber for etching the sacrificial material. The etchant circulation via the inner circulation loop is stopped and switched into the outer circulation loop upon the arrival of the following etchant feeding during the following feeding cycle. The time interval between any two consecutive etchant feedings is also adjustable.

In order to expedite the chemical reaction between the selected etchant and the sacrificial material inside the etch chamber, the selected spontaneous vapor phase etchant preferably has a pressure from 0.1 to 15 torr. The etchant is mixed with one or more diluent gases with a partial pressure preferably from 20 to 700 torr. Such a gas mixture is particularly useful for removing the sacrificial materials underneath the functional layers of the microstructure.

In an embodiment of the invention, an etching method comprises: loading a microstructure into an etch chamber, wherein the microstructure comprises a sacrificial material and one or more structural materials; providing a first discrete amount of spontaneous vapor phase etchant recipe during a first feeding cycle of a sequence of feeding cycles for removing the sacrificial material; and providing a second discrete amount of the etchant recipe after the first feeding cycle and during a second feeding cycle that follows the first feeding cycle of the sequence of feeding cycles for removing the sacrificial materials.

In another embodiment of the invention, an etching method comprises: (a) establishing a first pressure inside a first chamber, wherein the first pressure is equal to or lower than a pressure in a second chamber that contains a spontaneous vapor phase etchant; (b) filling the first chamber with the etchant; (c) filling the first chamber with a diluent gas such that the pressure inside the first chamber reaches a second pressure that is higher than the first pressure; and (d) circulating the etchant and the diluent gas through the etch chamber.

In another embodiment of the invention, an etching method for etching a sample in an etch chamber comprises: circulating a first amount of spontaneous vapor phase etchant via a first loop that passes through the etch chamber for etching the sample; and circulating a second amount of the etchant via a second loop that passes through the etch chamber and a first chamber other than the etch chamber, wherein the first chamber is not part of the first loop.

Etching Process with Controlled Etching Rate

As yet another way of example, the sacrificial material can be removed using one or more selected spontaneous vapor phase etchants at a controlled etching rate as set forth in U.S. patent application Ser. No. 10/666,671, filed Sep. 17, 2003, the subject matter being incorporated herein by reference.

For efficiently and uniformly removing sacrificial layers in microstructures using selected gas phase etchant, the etching process is performed with controlled etching rate by feeding the etchant based on a detection of an amount of the etchant or an etch product. In an embodiment of the invention, an etching method comprises: loading a microstructure into an etch chamber of the etch system, wherein the microstructure comprises a sacrificial material and one or more structural materials; providing an amount of a spontaneous vapor phase etchant recipe to the etch system; and providing an additional amount of the etchant recipe to the etch system at a time that is determined based on a measurement of an amount of a chemical species.

In another embodiment of the invention, the etching method comprises: loading a microstructure into an etch chamber of an etching system; and providing an etchant recipe to the etch chamber over time, wherein an amount of the etchant recipe per time unit varies.

In yet another embodiment of the invention, the etching method comprises: providing an etchant recipe to the etch chamber over time, wherein an amount of the etchant is varied when a change of a measured parameter beyond a predetermined value.

In yet another embodiment of the invention, an etching method comprises: collecting data of a parameter during a first etching process for a first microstructure using an etchant recipe; determining a variation profile of the parameter in the first etch process; and etching a second microstructure in a second etching process using the etchant recipe based on the collected data of the parameter in the first etching process.

In yet another embodiment of the invention, the etching method comprises: collecting a plurality of data of a parameter that characterizes an etching process using an etchant recipe; storing the collected data; and etching a microstructure using the etchant recipe based on the collected data of the parameter.

In yet another embodiment of the invention, an etching method comprises: loading a microstructure into an etch chamber of an etching system, wherein the microstructure comprises a sacrificial material and one or more structural materials; and etching the sacrificial material using a spontaneous vapor phase etchant recipe under a pressure of 1 atmosphere or higher.

Etching Method with Etchant Having Pre-Determined Mean-Free-Path

As yet another way of example, the sacrificial material can be removed using one or more selected spontaneous vapor phase etchants having a mean-free-path corresponding to the minimum thickness of the sacrificial layers between the structural layers of the microstructure, as set forth in U.S. patent application Ser. No. 10/666,002, filed Sep. 17, 2003, the subject matter being incorporated herein by reference.

In an embodiment of the invention, the etching process for removing a sacrificial material that is disposed within a gap between two structural layers of a microstructure using a vapor phase etchant recipe is disclosed. The method comprises: determining a size of the gap; preparing the vapor phase etchant recipe such that a mean-free-path of the etchant recipe is equal to or less than the gap size; and removing the sacrificial material of the microstructure using the prepared etchant recipe.

In another embodiment of the invention, a method is disclosed. The method comprises: loading a microstructure having a sacrificial material disposed within a gap between two vertically disposed structural layers of the microstructure into an etch system, wherein the gap has a size less than 1.5 micrometer; preparing a vapor phase etchant recipe such that a mean-free-path of the etchant recipe is equal to or less than the gap size; and removing the sacrificial material of the microstructure using the prepared etchant recipe.

In yet another embodiment of the invention, a method is disclosed. The method comprises: loading a microstructure having a sacrificial material disposed within a gap between two vertically disposed structural layers of the microstructure into an etch system; preparing a vapor phase etchant recipe such that a mean-free-path of the etchant recipe is equal to or less than 1.5 micrometers; and removing the sacrificial material of the microstructure using the prepared etchant recipe.

In yet another embodiment of the invention, a method is disclosed. The method comprises: loading a microstructure having a sacrificial material disposed within a gap between two adjacent vertically disposed structural layers of the microstructure into an etching system; preparing a vapor phase etchant recipe having a pressure higher than 2 atmospheres; and removing the sacrificial material of the microstructure using the prepared etchant recipe.

In yet another embodiment of the invention, a method for fabricating a micromirror is disclosed. The method comprises: preparing a substrate; depositing one or more sacrificial layers; forming a mirror plate and a hinge layer on the one or more sacrificial layers; preparing a vapor phase etchant recipe such that a mean-free-path of the etchant recipe is equal to or less than a minimum thickness of the one or more sacrificial layers; and removing the sacrificial layers using the prepared etchant recipe.

End Point Detection in Etching Process

During the etching process, accurate detection of the end of the etching process is certainly desirable for avoiding over-etch and under-etch. A method used for the etching of layers or areas, and in particular, for determining an end of the etching reaction is set forth in U.S. patent application Ser. No. 10/269,149, filed Oct. 12, 2002, the subject matter being incorporated herein by reference.

In one embodiment of the invention, a method for etching a sample comprises: providing a sample to be etched in a chamber; providing a vapor phase etchant to the chamber to etch the sample, the vapor phase etchant capable of etching the sample in a non-energized state; monitoring the gas from the etching chamber; and determining the end point of the etch based on the monitoring of the gas from the etching chamber.

Another example of the invention is a method for etching a sample, comprising: providing a sample to be etched to an etching chamber; passing a gas phase etchant through the etching chamber; impeding the gas flow out of the etching chamber, wherein the impedance is less than infinity but greater than 0; analyzing the gas from the etching chamber and determining an end of the etch.

A further aspect of the invention is an etching method, that comprises etching a material from a sample with a gas phase etchant; monitoring one or more gas components from the etching reaction substantially in the absence of plasma and determining the endpoint of the etching reaction based on the monitoring of the one or more gas components.

Another embodiment of the invention is a method for etching a material, comprising: performing an etch on a material on a substrate by providing an etchant so as to chemically but not physically etch the material on the substrate; monitoring an etch product of the material being etched; and determining an endpoint of the etch of the material based on the monitoring of the etch product.

Still another example of the invention is a method, comprising: a) providing a sample to be etched in a chamber; b) providing an etchant to the chamber, capable of etching the sample; c) providing no or substantially no impedance to gas exiting the etching chamber; d) monitoring a partial pressure of an etch product; repeating steps a) to d) except providing an increased impedance each time steps a) to d) are repeated, until an impedance is reached that allows for determining an endpoint based on monitoring the partial pressure of the etch product.

Another part of the invention is an apparatus. The apparatus comprises an etching chamber; a source of a vapor phase spontaneous chemical etchant; a gas flow line for recirculating the etchant; a gas analyzer connected to the etching chamber or to the gas flow line downstream of the etching chamber, though preferably upstream of any impedance in the gas out flow line from the etching chamber.

Another example of the apparatus of the invention comprises: an etching chamber; a source of etchant capable of being in fluid communication with an entrance aperture in the etching chamber; an exit flow line connected to an exit aperture in the etching chamber; and an impedance valve within the exit flow line for providing an impedance to the gas flow out of the etching chamber.

Yet another apparatus in accordance with the present invention is an apparatus comprising: an etching chamber; a holder for holding a sample to be etched; a source of gas phase etchant for supplying a gas phase etchant to the etching chamber, wherein the gas phase etchant is a fluoride compound capable of etching a sample in a non-energized state; and a gas analyzer for analyzing gas components from the etching of the sample.

Load-Lock

As discussed above, the micromirror array experiences multiple processing steps in different environments. For example, fabrication (e.g. deposition and patterning) of the structure members of the micromirror array is performed in an environment entailing the requirements for the fabrication. However, such fabrication environment is generally not suitable or oftentimes does not allow execution of other processes, such as etching process. Transfer of the micromirror from one environment to another is thus required. During the transfer, the micromirror array device may be contaminated or even damaged. For this reason, a load-lock can be provided, as shown in FIG. 19.

Figure 19:
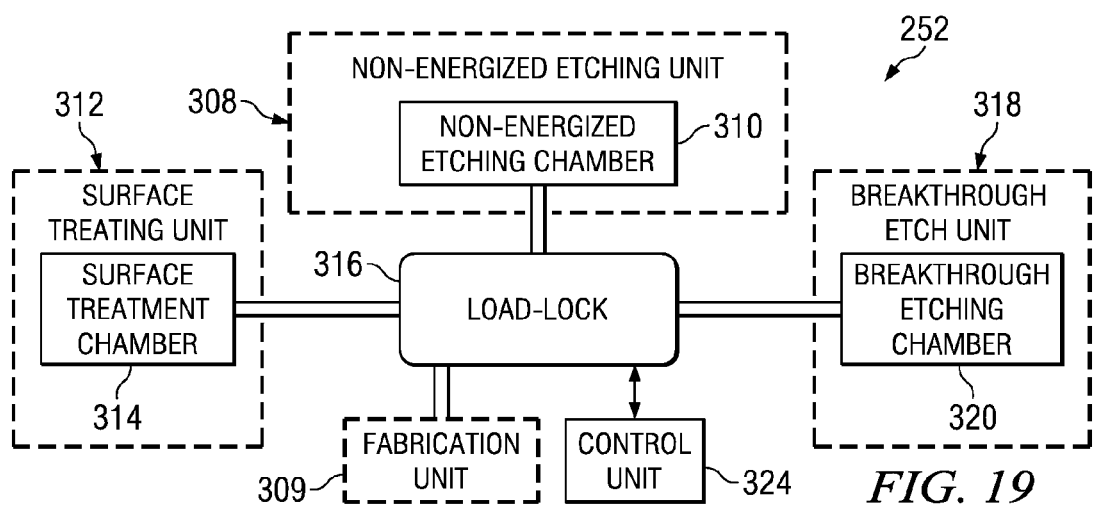
FIG. 19 illustrates a load-lock system for use in the fabrication a micromirror device according to an embodiment of the invention.

Referring to FIG. 19, load-lock 316 is connected to other units used for fabricating or treating the micromirror array. Specifically, the load-lock can be connected to the fabrication unit 390 wherein structure members of the micromirrors are deposited and patterned on a substrate, such as glass, non-energized etching unit 308 having non-energized etching chamber 310 wherein the sacrificial material can be removed by non-energized etchants; and breakthrough etching unit 318 having breakthrough etching chamber 320 in which breakthrough etching can be performed. The load-lock may also be connected to other processing units, such as surface treating unit 312 having surface treatment chamber 314 wherein surface treatments, such as surface roughing, cleaning, surface coating, and lubricating can be performed. In fact, each unit may comprise multiple chambers and other utilities as desired.

When a micromirror array needs to be transferred from one unit to another, for example, from the breakthrough etching unit to the non-energized etching unit, the micromirror array device is loaded to the load-lock from the breakthrough etching unit, and then transferred to the non-energized etching unit. In this way, the micromirror array will not be exposed to open (e.g. air) environment, risks of contamination and damage are thus eliminated. The load-lock may itself comprise facilities for processing (e.g. cleaning or pre-preparation is necessary) the micromirror array en route from one unit to another.

Control unit 324 may be provided for controlling the operation of the load-lock. The control unit can be a computing device enabled of data and instruction processing, and synchronizing operations of the units.

Die Level and Wafer Level Assembly

After removal of the sacrificial layers, the released micromirror array is assembled with an array of electrodes and circuitry to form a micromirror array device (step 264). According to the invention, the assembling can be carried out in either a die level or wafer-level.

Die Level Assembly

Figure 20A:
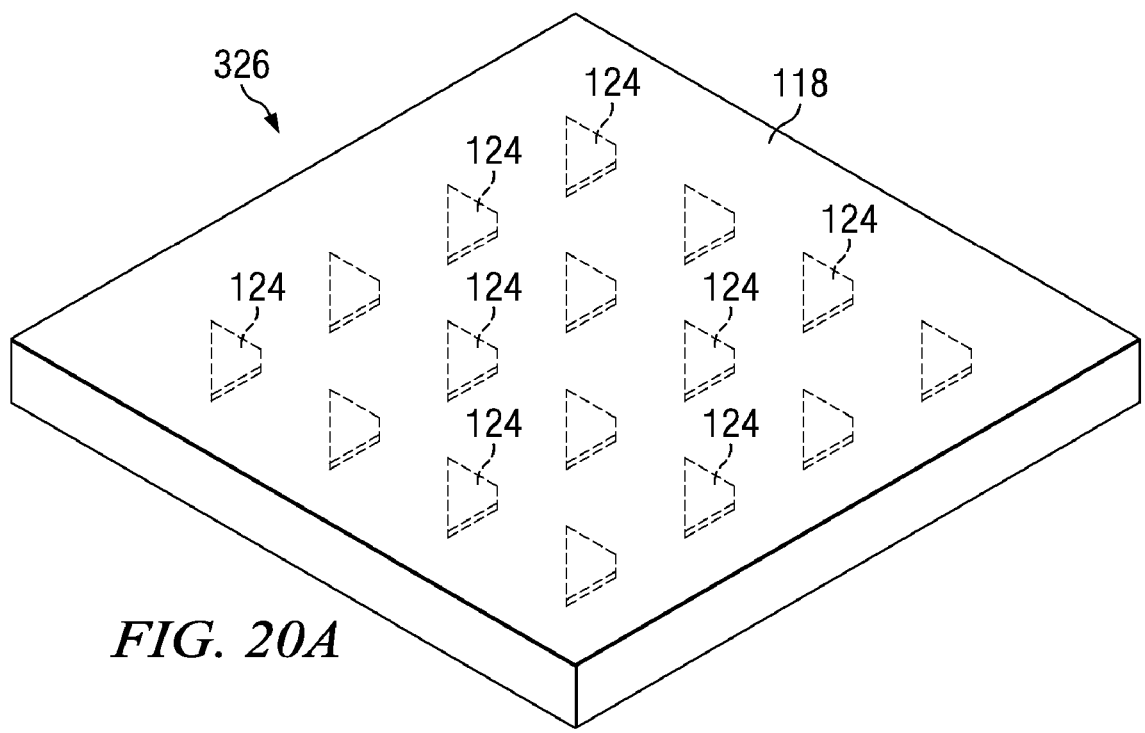
FIG. 20a illustrates a semiconductor substrate having an array of electrodes and circuitry formed thereon.
Figure 20B:
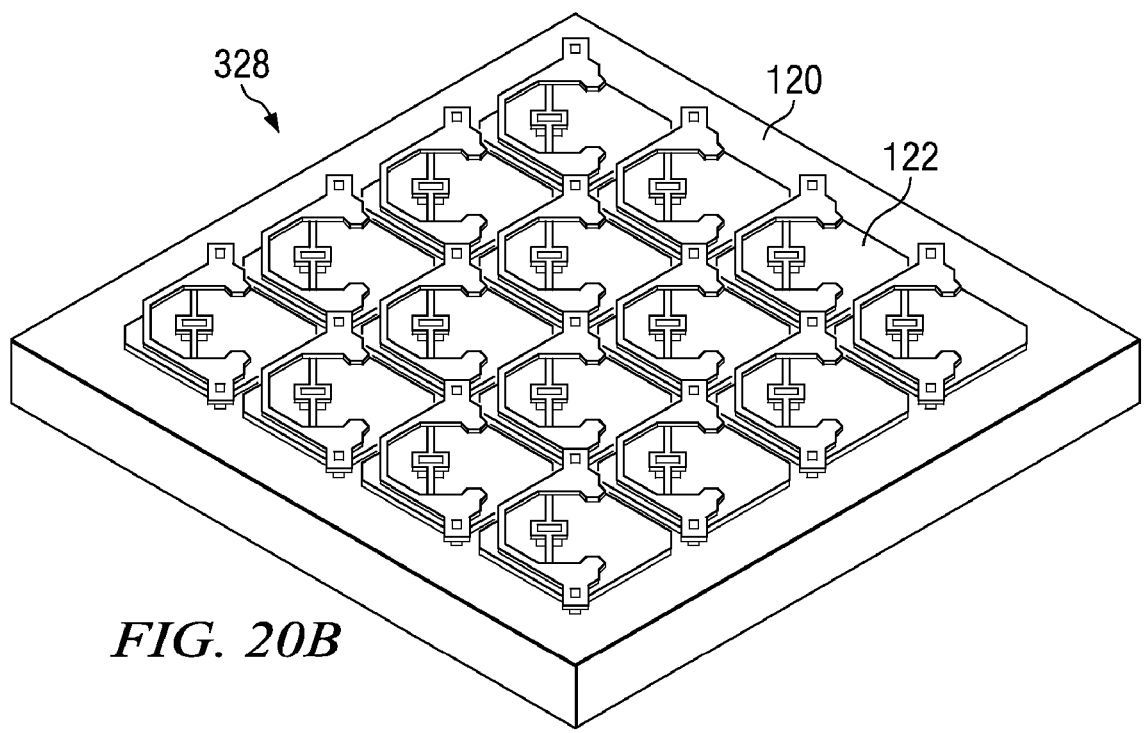

On a die level assembly, a micromirror die having an array of micromirrors is separated from the wafer on which multiple micromirror dies are formed using, for example, the fabrication method as discussed above. The micromirror die is then aligned and bonded to an electrode die having an array of electrodes and circuitry formed thereon, as demonstratively illustrated in FIG. 20. Referring to FIG. 20, electrode die 326 comprises an array of electrodes and circuitry formed on silicon substrate 118. Micromirror array die 328 comprises an array of released micromirrors 122 formed on light transmissive substrate 120 such as glass. The micromirror array die and electrode and circuitry die are then aligned together such that each electrode is at a location proximate to a micromirror, and can thus be electrostatically coupled with the mirror plate of the micromirror. When an electrostatic field with a pre-determined magnitude is established between the mirror plate and the associated electrode, the mirror plate is operable to rotate to the ON or OFF state.

In the assembly, the distance between the micromirror die and the electrode die can be fixed with a spacer disposed between the substrates 118 and 120, or alternatively, can be maintained with a plurality of in-array pillars as discussed with reference to FIGS. 9a and 9b. The dies are then bonded together through the spacer and/or the pin-array pillars. The bond may or may not be hermetic.

Wafer Level Assembly

Other than assembling the micromirror dies and electrode and circuitry dies on the die-level, the assembling can be performed on the wafer-level as set forth in U.S. patent application Ser. No. 10/167,361, filed Jun. 11, 2002, the subject matter being incorporated herein by reference.

As a way of example, FIG. 21a illustrates a micromirror array wafer 5. For simplicity and demonstration purposes, four micromirror dies 3a, 3b, 3c, and 3d are illustrated therein. Each die 3a to 3d comprises one or more microstructures which have already been released in a suitable etchant. As illustrated in FIG. 21b, epoxy can be applied in the form of beads 51a to 51d along each side of the die area, or as beads 52a to 52d at each corner of the die area. Or, epoxy ribbons 53a and 53b could be applied along two sides of each die, or a single ribbon 57 could be applied substantially surrounding an entire die. Of course many other configurations are possible, though it is desirable that the die not be fully surrounded with an epoxy gasket as this will prevent air or other gas from escaping when the two wafers are pressed together during a full or partial epoxy cure. And, of course, it is preferable, for higher manufacturing throughput, to use a common epoxy application method throughout the entire wafer (the different types of applications in FIG. 21B are for illustrations purposes only). Also, the areas in which epoxy is applied can first have a sacrificial material deposited in that area (preferably in an area larger than the bead or band of epoxy due to expansion of the epoxy under compression). The sacrificial material could also be applied to the entire wafer except in areas having microstructures thereon. Also, a conductive epoxy (or other adhesive) could be used in order to make electrical contact between the wafer having circuitry and electrodes and the wafer having the micromirrors thereon.

In FIG. 21C, electrode array wafer 25 and micromirror array wafer 5 with microstructures (and optionally circuitry) are brought into contact with each other. The final gap between the two wafers can be any size that allows the two wafers to be held together and singulated uniformly. Because gasket beads will expand upon application of pressure (thus taking up valuable real estate on a wafer with densely positioned die areas), it is preferable that the gap size be larger than 1 um, and preferably greater than 10 um. The gap size can be regulated by providing spacer mixed in with the epoxy (e.g. 25 um spacers). However, spacers may not be necessary depending upon the type of microstructure and the amount of pressure applied.

FIG. 21D shows the micromirror wafer 5 and electrode and circuitry wafer 25 bonded together. Horizontal and vertical score or partial saw lines 21a and 21b are provided on both electrode array wafer 25 and micromirror array wafer 5 (lines not shown on wafer 5). Preferably the score lines on the two wafers are offset slightly from each other at least in one of the (horizontal or vertical). This offset scoring or partial sawing allows for ledges on each die when the wafer is completely singulated into individual dies (see FIG. 23).

Figure 22A:
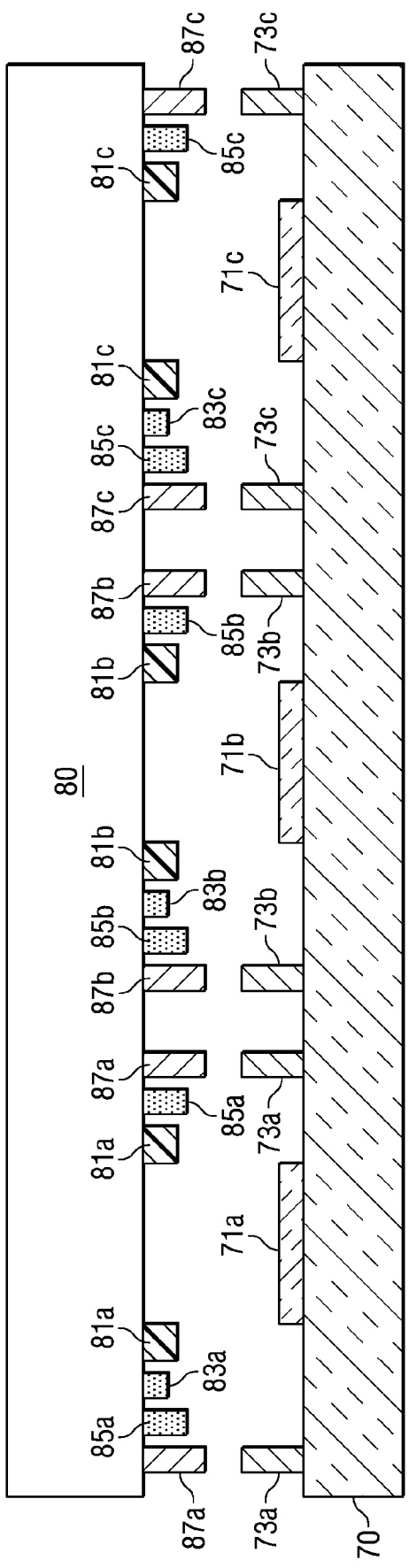
FIG. 22a is a cross-section view of the electrode wafer in FIG. 21a and micromirror wafer in FIG. 21b during assembling.
Figure 22B:
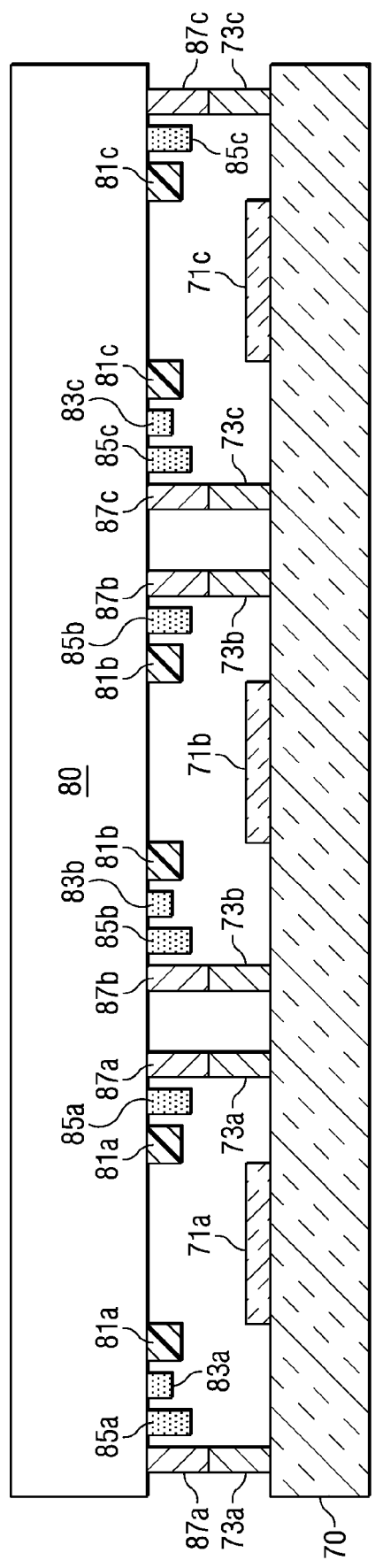

As another way of example, FIGS. 22A and 22B show cross-section views of two wafers that will be joined together and then singulated. A plurality of mirror arrays 71a to 71e are formed on micromirror wafer 70. After the mirrors are released, a metal for compression bonding is applied (areas 73a to 73e) around each mirror array. Of course more arrays could be formed on the wafer. On electrode and circuitry wafer 80 (e.g. semiconductor) are formed masks 81a-e which will block visible light around a perimeter area of each die from reaching the mirror arrays after the two wafers are bonded and singulated. As an alternative feature, areas of lubricant 83a-e, areas of getter material 85a-e, and areas of metal for compression bonding 87a-e can also be applied. The lubricant applied to the wafer as a gasket, band or drop on the wafer, can be any suitable lubricant, such as the various liquid or solid organic (or hybrid organic-inorganic materials) set forth in U.S. Pat. Nos. 5,694,740 5,512,374, 6,024,801, and 5,939,785, each of these being incorporated herein by reference. The metal for compression bonding could be any suitable metal for this purpose such as gold or indium. (Alternatively, if an adhesive is used, the adhesive could be any suitable adhesive, such as an epoxy or silicone adhesive, and preferably an adhesive with low outgassing). Of course any combination of these elements could be present (or none at all if the bonding method is other than an adhesive bonding method). Preferably one or more of the mask, lubricant, getter and bonding material are present on the wafer 80 prior to bonding. Also, the lubricant, getter and bonding material could be applied to only the micromirror array or electrode wafer or both wafers. In an alternate embodiment, it may be desirable to apply the lubricant and getter to the electrode wafer around the circuitry and electrodes, with bonding material on both wafers.

Figure 23:
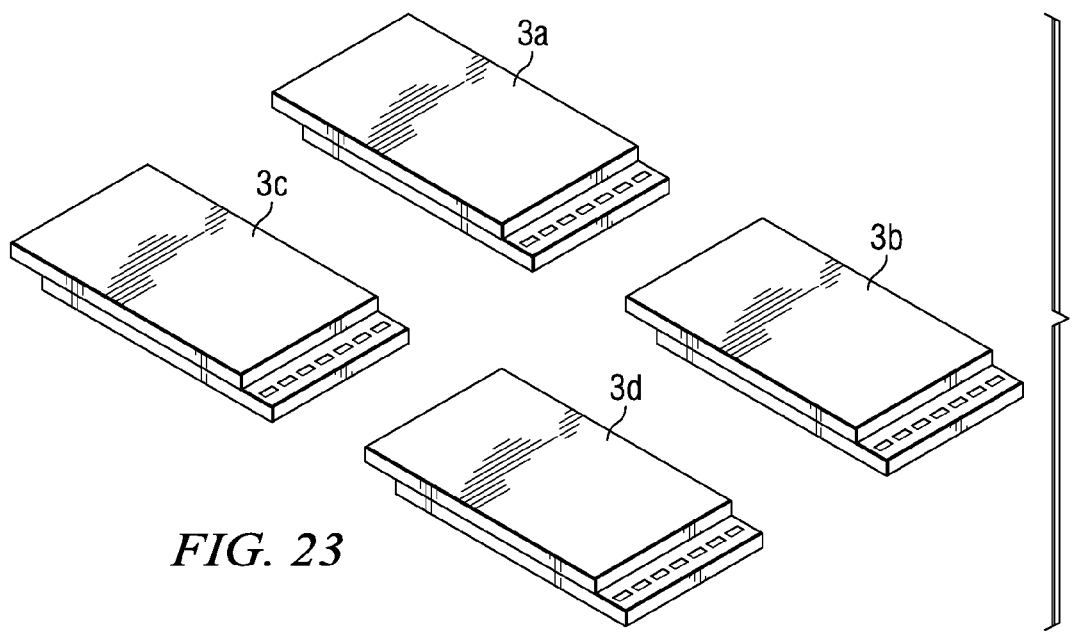
FIG. 23 illustrates singulated micromirror array assembly.

Of course, depending upon the micromirror application, the mask (or the lubricant or getter) may be omitted (e.g. for non-display applications). Also, the bands of lubricant, getter and bonding material need not fully encircle the "die area" on the wafer, but could be applied in strips of dots as illustrated in FIG. 21B. If the bonding material does not fully encircle the micromirror die area, then, prior to singulation, it is preferred that the bonding material "gap" be filled so as to protect the micromirror array devices during singulation (from particulate and/or liquid damage depending upon the singulation method). Then, the two wafers are aligned, bonded, cured (e.g. with UV light or heat depending upon the type of adhesive used) and singulated as set forth above. FIG. 23 illustrates the singulated micromirror array device assembly.

There are many alternatives to the method of the present invention. In order to bond the two wafers, epoxy can be applied to the one or both of the upper and lower wafers. In a preferred embodiment, epoxy is applied to both the circumference of the wafer and completely or substantially surrounding each die/array on the wafer. Spacers can be mixed in the epoxy so as to cause a predetermined amount of separation between the wafers after bonding. Such spacers hold together the upper and lower wafers in spaced-apart relation to each other. The spacers act to hold the upper and lower wafers together and at the same time create a space in which the movable mirror elements can move. Alternatively, the spacer layer could comprise walls or protrusions that are micro-fabricated. Or, one or more wafers could be bonded between the upper and lower wafers and have portions removed (e.g. by etching) in areas corresponding to each mirror array (thereby providing space for deflection of the movable elements in the array). The portions removed in such intermediate wafers could be removed prior to alignment and bonding between the upper and lower wafers, or, the wafer(s) could be etched once bonded to either the upper or lower wafer. If the spacers are micro-fabricated spacers, they can be formed on the lower wafer, followed by the dispensing of an epoxy, polymer, or other adhesive (e.g. a multi-part epoxy, or a heat or UV-cured adhesive) adjacent to the micro-fabricated spacers. The adhesive and spacers need not be co-located, but could be deposited in different areas on the lower substrate wafer. Alternative to glue, a compression bond material could be used that would allow for adhesion of the upper and lower wafers. Spacers microfabricated on the lower wafer (or the upper wafer) and could be made of polyimide, SU-8 photo-resist.

Instead of microfabrication, the spacers could be balls or rods of a predetermined size that are within the adhesive when the adhesive is placed on the lower wafer. Spacers provided within the adhesive can be made of glass or plastic, or even metal so long as the spacers do not interfere with the electrostatic actuation of the movable element in the upper wafer. Regardless of the type of spacer and method for making and adhering the spacers to the wafers, the spacers are preferably from 1 to 250 microns, the size in large part depending upon the size of the movable mirror elements and the desired angle of deflection. Whether the mirror arrays are for a projection display device or for optical switching, the spacer size in the direction orthogonal to the plane of the upper and lower wafers is more preferably from 1 to 100 microns, with some applications benefiting from a size in the range of from 1 to 20 microns, or even less than 10 microns.

Regardless of whether the microstructures and circuitry are formed on the same wafer or on different wafers, when the microstructures are released by removal of the sacrificial layer, a sticking force reducing agent can be applied to the microstructures (micromirrors, microrelays, etc) on the wafer to reduce adhesion forces upon contact of the microstructures with another layer or structure on the same or opposing substrate. Though such adhesion reducing agents are known, in the present invention the agent is preferably applied to the wafer before wafer bonding (or after wafer bonding but before singulation), rather than to the singulated die or package for the die. Various adhesion reducing agents, including various trichlorosilanes, and other silanes and siloxanes as known in the art for reducing stiction for micro electromechanical devices, as mentioned elsewhere herein.

Also, a getter or molecular scavenger can be applied to the wafer prior to wafer bonding as mentioned above. The getter can be a moisture, hydrogen, particle or other getter. The getter(s) is applied to the wafer around the released MEMS structures (or around, along or adjacent an array of such structures, e.g. in the case of a micromirror array), of course preferably not being in contact with the released structures. If a moisture getter is used, a metal oxide or zeolite can be the material utilized for absorbing and binding water (e.g. StayDry SD800, StayDry SD1000, StayDry HiCap2000—each from Cookson Electronics). Or, a combination getter could be used, such as a moisture and particle getter (StayDry GA2000-2) or a hydrogen and moisture getter (StayDry H2-3000). The getter can be applied to either wafer, and if adhesive bonding is the bonding method, the getter can be applied adjacent the epoxy beads or strips, preferably between the epoxy and the microstructures, and can be applied before or after application of the adhesive (preferably before any adhesive is applied to the wafer(s). In one embodiment, a getter (or getters if more than one type of getter is used) are provided in a trench or other cavity formed in either (or both) substrates. For example, a trench extending along one or more sides of a micromirror array (or around the entire periphery of the array) could be formed prior to depositing the sacrificial layer and thin films (or at the end before or after release of the micromirrors). Such a trench (or cavity) could be formed in a silicon substrate (e.g. with circuitry and electrodes thereon if formed as the dual substrate approach set forth above, or circuitry, electrodes and micromirrors thereon if formed monolithically). Or such a trench or cavity for the getter(s) could be formed in the glass substrate. It is also possible to form a trench or cavity in both substrates with the same or different getters deposited therein.

Alternative Assembling Methods

Other than the assembling methods as discussed above, the micromirror array wafer (or die) and electrode and circuitry array wafer (or die) can be assembled with other alternative ways, as set forth in U.S. patent application Ser. No. 10/869,539, filed Jun. 15, 2004, the subject matter being incorporated herein by reference.

Sacrificial Substrate

During the assembling and packaging processes, surfaces of the micromirror device may be contaminated. Contamination of the interior surfaces of the assembly can be prevented by hermetically sealing of the substrates with proper sealing material and bonding and sealing processes. However, the exterior surface of the assembly, such as the top surface of the glass substrate (e.g. substrate 80 in FIG. 22A or substrate 5 in FIG. 21A) 116 is exposed to contamination. To solve this problem, a sacrificial substrate is provided and sealed with the exposed substrate such that the top surface of the substrate can be encapsulated between the sacrificial substrate and the substrate during the assembly and packaging process, as illustrated in FIG. 24.

Figure 24:
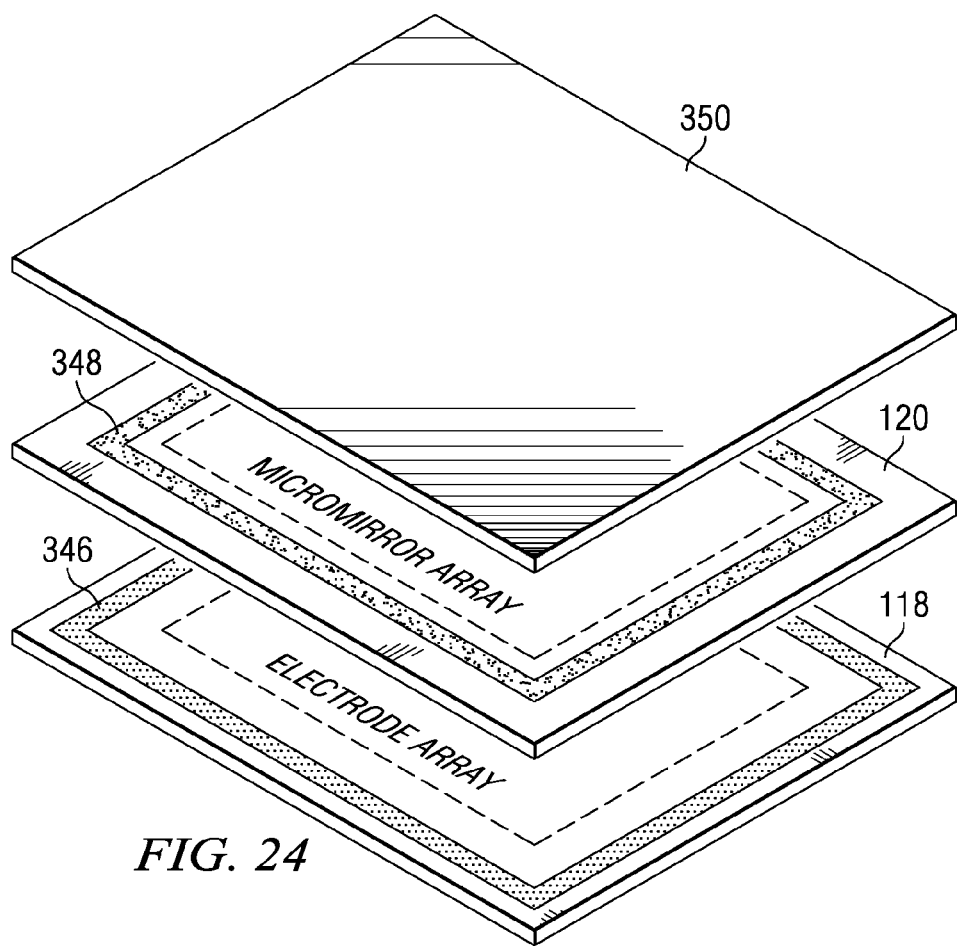
FIG. 24 illustrates a cross-section view of a micromirror array assembly having a plurality of in-array pillars.

Referring to FIG. 24, substrate 118 having the electrode array formed thereon can be hermetically sealed with substrate 120 on which the micromirror array is formed. The hermetical seal is made through sealing material 346. The top surface of substrate 118 and the bottom surface of substrate 120 can thus be prevented from contamination. To protect the top surface of substrate 120, sacrificial substrate 350 is provided and bonded to substrate 120 with sealing material 348. The sealing of substrates 350 and 120 can be performed before or after the hermetically sealing of substrates 118 and 120, or during the fabrication process.

For example, during the fabrication of the micromirrors on substrate 120, sealing rings, such as sealing ring 348 is deposited on the top surface of substrate 120. Sacrificial substrate 350, which can be glass, is bonded to substrate 120 with the sealing rings 348. The sealing rings can also be deposited on the sacrificial substrate. The sealing of the sacrificial substrate and substrate 120 can be performed before the fabrication of the micromirrors, for example before depositing a sacrificial layer on substrate 120. Alternatively, the sealing of the sacrificial substrate and substrate 120 is made after the formation of the functional components of the micromirrors but before removing the sacrificial material through etching. In another example, the sealing of the sacrificial substrate and substrate 120 can be made after the removal of the sacrificial material but before assembling substrates 120 and 118.

When the micromirror arrays on substrate 120 and the electrode arrays on substrate 118 are formed, the two substrates are sealed using sealing material 346. Then the assembly is cut into dies, each die comprising a micromirror array device, such as the micromirror array device shown in FIG. 23. After the singulation, the sacrificial substrate 350 on each micromirror array device is removed. Instead of removing the sacrificial substrate after singulation, the sacrificial substrate can be removed at other stages during the fabrication. For example, the sacrificial substrate can be removed before or during or even after the device testing in which the product quality and performances are evaluated. The removal of the sacrificial substrate can also be carried out before or during packaging the micromirror array device but before encapsulating the device with the attachment of the a package cover lid.

Statistical Die Matching

In industrial manufacturing, a wafer (e.g. the micromirror wafer and the electrode wafer) often has one or more non-passing dies that do not satisfy pre-determined product quality and performance requirements. The locations of the passing (or non-passing) dies on wafers vary from wafer to wafer. As a result, a passing die on one wafer may be assembled with a non-passing die on another wafer, resulting in reduction of the production yield.

In order to maximize the production yield, a statistical die matching can be performed before assembling, as set forth in U.S. patent application Ser. No. 10/875,987, filed Jun. 23, 2004, the subject matter being incorporated herein by reference. The method may comprise: providing a first and second set of wafers, each wafer having a component of the micromirror array device; inspecting the quality of each wafer from the first and second set of wafers; and matching a wafer from the first set of wafers with a wafer in the second wafer set based on the inspection. Specifically, the dies on wafers, including micromirror dies on micromirror wafers and electrode dies on electrode wafers are evaluated after fabrications. The evaluation identifies the locations of the non-passing and passing dies on each wafer. According to the location information, a wafer of one kind (e.g. micromirror wafer or electrode wafer) is selected to match another wafer of another kind (e.g. electrode wafer or micromirror wafer) such that the production yield is maximized. The production yield can be measured in terms of the total number of passing die assemblies or the total number of non-passing die assemblies. A good die assembly is an assembly wherein both dies of the assembly are passing dies, or are non-passing dies; and a non-passing die assembly comprises a "bad' die and a passing die. For example, when a passing micromirror die (or electrode die) is assembled with a non-passing electrode (or micromirror die), such a die assembly is a non-passing die assembly. When the total number of passing die assemblies is maximized, or equivalently, the total number of non-passing die assemblies is minimized, the production yield is maximized.

Surface Treatment

Referring back to FIG. 17, the singulated micromirror array assembly can then be packaged (step 268) using a suitable packaging method, as discussed earlier with reference to FIGS. 11 to 16. Before packaging or during the packaging process but before hermetically seal the package with the package cover lid, surfaces of the structure members, especially the contacting surfaces of the mirror plates and stopping mechanisms of the micromirrors are preferably treated by cleaning (step 284), coating with a self-assembled-monolayer (SAM) (step 286), and lubricating (step 272) so as to eliminate stiction, as set forth in U.S. patent application Ser. No. 10/713,671, filed Nov. 13, 2003, U.S. patent application Ser. No. 10/811,449, filed Mar. 26, 2004, the subject matter being incorporated herein by reference.

The contacting surfaces can be cleaned in many ways. An exemplary surface cleaning process may comprise steps of: loading the device into a chamber; preparing a cleaning agent comprising ozone gas and a co-agent that comprises oxygen-containing molecules; and introducing the prepared cleaning agent into the chamber, for cleaning the surface of the microelectromechanical device in the chamber. The oxygen-containing co-agent can be water vapor, hydrogen peroxide vapor, acetic acid vapor, or other suitable chemical agents. The cleaning process is preferably performed at a temperature between 40° C. and 400° C., or between 100° C. and 200° C., and under a pressure between 1 Torr and 5000 Torr.

After surface cleaning, a coating agent can be prepared and introduced to the contacting surfaces of the micromirror array device. The coating agent is preferably a chemical agent such that after introducing the agent onto the contacting surfaces of the micromirror array device, the agent forms a coating layer that is chemically bonded to the contacting surface. Alternatively, the coating agent can be a chemical agent such that after introducing the agent onto the contacting surfaces, the agent forms a coating layer that is physically adsorbed on the contacting surfaces. Moreover, the coating agent can be an agent that comprises a first and second coating components such that after introducing the coating agent onto the contacting surfaces, the first component of the coating agent forms a coating layer that is chemically bonded to the contacting surfaces, and the second component of the coating agent forms another layer that is not chemically bonded to the contacting surfaces.

The cleaning agent, as well as the coating agent can be introduced onto the contacting surfaces in many ways. For example, the micromirror array device can be loaded into a coating chamber, then a first component of the cleaning agent can be introduced into the chamber such that the pressure inside the chamber is at a first pressure value; and then a second component of the cleaning agent can be introduced into the chamber such that the pressure inside the chamber is at a second pressure value that is higher than the first pressure value. For example, the first pressure is from 1 Torr to 700 Torr, and the second pressure can be from 10 Torr to 5000 Torr.

The coating agent may comprise an organosilane, an organochlorosilane, a halogen-substituted organochlorosilane, or a perfluoropolyether. The coating agent can also be selected from a group comprising: a carboxylic acid material having the formula $CF_3(CF_2)_a(CH_2)_bCOOH$, wherein a is greater than or equal to 0, and b is greater than or equal to 0; a fluorocarbon material having the formula $C_nH_mF_{(2n+2-m)}$, wherein n is greater than or equal to 1, and m is greater than or equal to 0 and less than (2n+2); a fluorocarbon amine material having the formula $N(C_nH_mF_{(2n+1-m)})_3$ wherein n is greater than or equal to 1 and m is greater than or equal to 0 and less than (2n+1); a fluorocarbon ether material having the formula $O(C_nH_mF_{(2n+1-m)})_2$ wherein n is greater than or equal to 1 and m is greater than or equal to 0 and less than (2n+1).

The coating with a SAM material is preferably performed at a temperature from 60° C. to 300° C., or from 100° C. to 200° C. with the pressure from 1 Torr to 760 Torr.

As another example, the contacting surfaces can be modified through a process comprising steps of: loading the assembly into a chamber; preparing a gaseous modification agent; and introducing the gaseous modification agent into the chamber such that the cleaning agent is delivered through a micro-opening of the assembly to the surface of the microelectromechanical device for modifying the surfaces of the microelectromechanical device, wherein the micro-opening has a characteristic dimension around 10 micrometers or less.

Lubricants and Application of the lubricants

In addition to the surfacing coating with monolayers, the contacting surfaces can also be lubricated with suitable lubricants, as set forth in U.S. patent application Ser. No. 10/890,352, filed Jul. 12, 2004, the subject matter being incorporated herein by reference.

The lubricant is preferably a material that does not form covalent bands with the target surface. It can be in a liquid state at the device operation temperature, such as 70° C. degrees or less, or 50° C. or less. The surface tension of the lubricant on the surface is desired to be low, such as 50 dynes/cm or less, or 20 dynes/cm or less. The lubricant may have a high boiling point (e.g. 150° C. or higher, or 200° C. or higher) or low vapor pressure such that the lubricant does not condense at low temperature or fully evaporate at high temperatures (e.g. 50° C. or more, or 70° C. or more, or even 200° C. or more) (the high temperature refer to the storage and operating range of the micromirror device). The lubricant is desired to be stable at a high temperature, such as up to 200° C. The viscosity of the lubricant in liquid phase can be of from 1 cP to 100 cP. Moreover, it is desired that the selected lubricant is able to form a physisorbed layer with a thickness of around 3 nm or less at a low partial pressure.

The lubricant can be a mono-ether or thio-ether (which can be unfluorinated, partially fluorinated, or perfluorinated), an amine, a phosphine, a borane material, a fluorinated organic material containing a ring structure (e.g. triazines), or a tetralkylsilane having four substituent groups, $R_1R_2R_3R_4Si$, wherein $R_1$ to $R_4$ are bonded to Si and are independently alkyl groups each preferably having 1 to 6 carbons. It is preferred that one of $R_1$ to $R_4$ groups is partially or fully fluorinated. The alkyl groups, $R_1$ to $R_4$ may or may not be that same, but preferably not labile, e.g. not reactive (e.g. do not hydrolyze). Examples include tetraperfluoroalkylsilanes such as perfluorinated tetramethylsilanes. For example, the lubricant can be a straight-chain fluorocarbon represented by $F_3C—(CF_2)_n—CF_3$, wherein n can be 4, 5 (e.g. FC-84, a product from Aka), 6 (e.g. a product from Exfluor), 7 (e.g. a product from Exfluor), and 8 (e.g. a product from Exfluor). As another example, the lubricant can be a perfluoroamine $CF_3 (CF_{2n})_3N$, wherein n can be 3 (i.e. perfluorotributylamine, e.g. FC-43, a product from Aka), 4(e.g. FC-70, a product from Aka), and 5 (i.e. perfluorotrihexylamine, e.g. FC-71, a product from 3M). As yet another example, the lubricant can be a perfluorocarbon with a ring structures, such as perfluorodecalin $C_{10}F_{18}$ (e.g. a product from Aldrich), perfluoromethyldecalin $C_{11}F_{20}$ (e.g. a product from Alfa Aesar), perfluoroperhydrophenil $C_{12}F_{22}$ (e.g. a product from Interchim), perfluoroperhydrofluorene $C_{13}F_{22}$ (e.g. a product from Interchim), perfluorotetradecahydrophenanthrene $C_{14}F_{24}$ (e.g. FC-5311, a product from Aka), or perfluorophenanthrene $C_{14}F_{24}$ (e.g. a product from SciInstrSvcs). As yet another example, the lubricant can be ring-structure perfluorocarbon with one or more oxygen linkage between rings, such as $C_{12}F_{24}O$, and single cycloether, as illustrated in FIG. 4. Alternatively, the lubricant may have fluorocarbon chains attached to a triazine ring, such as $C_{12}F_{21}N_3$, $C_{24}F_{45}N_3$ and $C_{30}F_{57}N_3$. The lubricant can also be a perfluorinated hydrocarbon having 20 carbons or less, such as alkanes, amines, alcohols, ethers, triazines and glycols.

The lubricant may be mixed with a diluent to form a lubricant solution. The lubricant is desired to be in a liquid phase at room temperature. For example the boiling point of the lubricant can be 30° C. or higher and/or the melting point is 10° C. or lower. The diluent may have a high vapor pressure at room temperature relative to the lubricant such that it does not condense on the target surface. Moreover, it is desired that the diluent is chemically stable at a temperature of 200° C. or higher. An exemplary diluent is a perfluorinated hydrocarbon having 20 carbons or less.

Capillary Tubing

The selected lubricant can be applied to the desired surfaces in many ways. For example, the lubricant can be held by a container that is disposed within the micromirror array device package. The lubricant evaporates from an opening of the container and contacts the desired surfaces to be lubricated. Alternatively, the selected lubricant can be disposed on a substrate of the microstructure package, as set forth in U.S. patent application Ser. No. 10/810,079, filed Mar. 26, 2004, and U.S. patent application Ser. No. 10/811, 449, filed Mar. 26, 2004, the subject matter of each being incorporated herein by reference.

The container containing the lubricant can be a capillary tubing, a capillary cylinder. By precisely defining the dimension of the capillary tubing (or the cylinder), the amount of lubricant for lubricating the contacting surfaces can be precisely controlled. For example, the capillary tubing may have an interior diameter of from 2 to 500 micrometers, or from 100 to 200 micrometers. And the interior volume of the capillary tubing can be from 10 pl to 10 µl, or from 30 pl to 2 µl.

Other methods of applying lubricants are also applicable. For example, the lubricants can be deposited within the micromirror array device assembly, particularly on the substrate on which the micromirrors are formed, as set forth in U.S. patent application Ser. No. 10/810,076, filed Mar. 26, 2004, the subject matter being incorporated herein by reference.

Other than lubricants, getter material can also be applied to avoid contamination of the micromirror array device, as set forth in U.S. patent application Ser. No. 10/810,076, filed Mar. 26, 2004, and U.S. patent application Ser. No. 10/869,539, filed Jun. 15, 2004.

Baking

During or after cleaning, coating with monolayer, and/or lubricating or even between the above processes, the micromirror array device may be baked at a temperature higher than the room temperature, preferably 100° C. or higher, or 120° degrees or higher, or 350° C. or higher for a time period of 10 minutes or longer, or 1 hour or longer, or 2 hours or longer, or 3 hours or longer, or 14 hours or longer, or even several days as appropriate for enhancing the application of the monolayers and lubricants. A backing process can also be performed after packing, specifically, after packaging but before cleaning and coating with monolayer, for example, backing the device at a temperature around 250° or higher for a time period of 14 days or longer.

Surface Roughing

In addition to coating and lubricating the contacting surfaces, surface roughing are also applicable to reduce stiction in the contacting surfaces (step 288). After surface roughing, effective contacting surfaces can be reduced. The surface roughing can be made in many ways, such as vapor phase etching using HF, and laser ablation, which will not be discussed in detailed.

In a fabrication process for a micromirror array device, energized and/or non-energized cleaning, coating, and lubricating processes may be performed more than once and in any desired sequence. For example, after coating with monolayer, an non-energized cleaning process can be performed. After a coating followed by lubricating, another coating process can be carried out.

8Following the surface treatment, the micromirror array device can be sealed, preferably hermetically sealed (step 274). This step can be executed in many ways, as discussed with reference to FIGS. 11 to 16, and as set forth in U.S. patent application Ser. No. 10/852,981, filed May 24, 2004, the subject matter being incorporated herein by reference.

As an alternative step, the packaged and sealed micromirror array device package can be baked at step 276. Such baking step may be performed for many reasons, such as expediting the evaporation of the lubricant materials from the container (e.g. the capillary tubing) onto the contacting surfaces, and solidifying the deposited coating layers on the contacting surfaces. As another alternative step, defect screen can be performed (step 278) on die or wafer level.

Pre-Installation Treatment

Pre-Oxidation

The micromirror array device may suffer from device failure when the deformable hinges experience plastic deformation that exceeds tolerable amounts. To solve this problem, the deformable hinge can be pre-processed for reducing plastic deformation by oxidizing the deformable hinge (step 292). The processing method can be performed at different stages of the fabrication and packaging process. Specifically, the method can be performed before or after patterning of the deformable element during the fabrication. The method can also be performed when a portion of the sacrificial layers is removed or after the sacrificial layers are fully removed. The method can also be implemented after the micromirrors has been released and before packaging the released micromirrors. Moreover, the method can be performed during the packaging stage but before the package is hermetically sealed, as set forth in U.S. patent application Ser. No. 10/766,776, filed Jan. 27, 2004, the subject matter being incorporated herein by reference.

As an example, the deformable hinge can be processed by: deflecting the deformable hinge to a deflected state; and oxidizing the deformable hinge in an oxygen-containing gas other than air while the deformable hinge is in the deflected state.

As another example, the deformable hinge can be processed by: oxidizing a material of the deformable hinge equivalent to at least 20 percent in thickness or volume of the deformable hinge by exposing the deformable hinge in an oxygen-containing gas other than air so as to reduce the droop.

As another example, the deformable hinge can be processed during a fabrication process but before the micromirror array device is fully released. Specifically, a portion of the sacrificial material is removed using a vapor phase etchant such that at least a portion of the hinge is exposed. The exposed hinge is then exposed in an oxygen-containing gas other than air followed by removal of the remaining sacrificial material.

Pre-Straining

In addition to the device failure when the deformable hinges experience plastic deformation that exceeds tolerable amounts, device failure may also arise when the deformable hinges deform plastically. For example, the operation states (e.g. the "natural resting state) of the micromirror array device change due to plastic deformation which in turn cause differences between the states to vary over time. The change of the states and variation of the relative distances may affect the performance of the micromirror array devices, especially those devices whose operations depend upon the differences between the states (e.g. the ON and OFF state of the micromirrors). When the plastic deformation exceeds a certain amount, the states or the difference between the states exceeds the tolerable amount—causing device failure. This problem can be solved by pre-straining the deformable hinges (step 296 in FIG. 17), as set forth in U.S. patent application Ser. No. 10/823,823, filed Apr. 13, 2004, the subject matter being incorporated herein by reference. The processing method can be performed at different stages of the fabrication and packaging process. Specifically, the method can be performed before or after patterning of the deformable element during the fabrication. The method can also be performed when a portion of the sacrificial layers is removed or after the sacrificial layers are fully removed. The method can also be implemented after the micromirrors has been released and before packaging the released micromirrors. Moreover, the method can be performed during the packaging stage but before the package is hermetically sealed, As a way of example, the deformable hinge can be processed by: deforming the hinge to the deformed state; holding the deformable element at the deformed state for a particular time period so as to acquire an amount of plastic deformation for the non-deformed state; and defining a new non-deformed state based on the original non-deformed state and the acquired plastic deformation.

As a way of example, the deformable hinge can be processed by: acquiring an amount of plastic deformation for the non-deformed state; defining a new non-deformed state according to the original non-deformed state and the acquired plastic deformation; and operating the micromirror at the new non-deformed state and the deformed state.

As a way of example, the deformable hinge can be processed by: determining a range of the difference between the states such that the micromirror operates properly when the difference of the states varies within the range; and limiting the variation of the states such that the difference between the states is within the determined range, further comprising: adjusting the non-deformed state through acquisition of an amount of plastic deformation for the non-deformed state such that the distance between the adjusted non-deformed state and the deformed state is within determined range.

Quality Inspection

WIPS

Before delivering the manufactured micromirror array devices to customers, quality and performance of the products are inspected. In fact, quality inspection is also valuable during the fabrication, especially before assembling the micromirror wafer to the electrode wafer. Specifically, quality inspection can be performed to identify the quality of the individual micromirror or electrode dies on each wafer. Based on such quality inspection and the locations of the passed and non-passed dies, the die matching process can be carried out so as to maximize the production yield. Even for the assembling process performed on the die level, quality inspection is still appreciated for maximizing the yield by discarding the non-passed dies while processing the passed dies.

The product quality can be inspected in many ways, one of which is set forth in U.S. patent application Ser. No. 10/875,602, filed Jun. 23, 2004, the subject matter being incorporated herein by reference. In this particular example, the product quality is characterized in terms of position uniformity of the mirror plates, and is evaluated by the reflectance of the mirror plates and statistical analysis of the illumination pattern of the reflected light from the mirror plates on a display target.

The illumination patterns comprising a set of images of a wafer are statistically analyzed so as to obtain a first order evaluation of the position uniformity of the mirror plates. Specifically, reflected light from the mirror plates after removal of the sacrificial materials are measured at a set of different positions corresponding to reflected light from mirror plates tilted from approximately from −1.0 degree (titled in one direction from the substrate) to +1.0 degree (tilted in another direction from the substrate). By statistically analyzing selected optical parameters describing the illumination pattern, such as the brightness distribution of the illumination pattern, quantitative evaluation of the mirror plate positions is obtained. Such quantitative evaluation can be used as basis for further product quality analysis.

An exemplar inspection procedure may comprise steps of: illuminating the wafer with a light beam; capturing a set of wafer images, one of which is associated with a number of micromirrors having mirror plates tilted in one direction from a substrate on which the micromirrors are formed, another one of which is associated with a number of micromirrors having mirror plates substantially parallel to the substrate, and yet another one of which is associated with a number of micromirrors having mirror plates tilted in another direction from the substrate or parallel to the substrate; and comparing the brightness of the captured images so as to qualitatively evaluate the micromirrors.

Another exemplary inspection procedure may comprise steps of: accepting a set of controlling parameters from a user through a user-interface generated by a computer-executable program code; and based on the received parameters and under a control of a computer; illuminating the wafer with a light beam; capturing a set of wafer images, one of which is associated with a number of micromirrors having mirror plates tilted in one direction from a substrate on which the micromirrors are formed, another one of which is associated with a number of micromirrors having mirror plates substantially parallel to the substrate, and yet another one of which is associated with a number of micromirrors having mirror plates tilted in another direction from the substrate; and comparing the brightness of the captured images so as to qualitatively evaluate the number of micromirrors substantially at a desired position in each die.

Another exemplary inspection procedure may comprise steps of: illuminating a die on the wafer with a light beam; capturing an image of the illuminated die, wherein the image presents a brightness distribution; and evaluating the uniformity of the micromirrors across the wafer based on the brightness distribution.

Another exemplary inspection procedure may comprise steps of: illuminating a first and second die on the wafer with a light beam; capturing an image for each of the illuminated dies, wherein each of the images presents a brightness distribution; and evaluating the uniformity of the micromirrors across the wafer based on the brightness distributions of the dies.

The inspection procedures can be performed with a computer-readable medium having computer executable instruction of qualitatively evaluating the product quality of a wafer having a set of dies, each die having an array of micromirrors. Such computer-readable medium may comprise: accepting a set of controlling parameters from a user through a user-interface generated by a computer-executable program code; and based on the received parameters and under a control of a computer, illuminating the wafer with a light beam; capturing a set of wafer images, one of which is associated with a number of micromirrors having mirror plates tilted in one direction from a substrate on which the micromirrors are formed, another one of which is associated with a number of micromirrors having mirror plates substantially parallel to the substrate, and yet another one of which is associated with a number of micromirrors having mirror plates tilted in another direction from the substrate; and comparing the brightness of the captured images so as to qualitatively evaluate the number of micromirrors substantially at a desired position in each die.

WORM

Another exemplar quality inspection method is set forth in U.S. patent application Ser. No. 10/875,555, filed Jun. 23, 2004, the subject matter being incorporated herein by reference.

In this particular example, product quality characterized in terms of uniformity of the deformable and/or deflectable elements is inspected with an optical resonance mapping mechanism on wafer-level.

The wafer may comprise a plurality of dies, each of which comprises a set of functional components with each functional component further comprises one or more freed deflectable and/or deformable elements. The deflectable elements have light reflective surfaces for reflecting incident light. The functional components each may or may not be a fully developed device—that is each functional component can be a portion of a desired device and wait for further process or processes.

In order to inspect the uniformity of the freed elements, an AC voltage having a small amplitude (a disturbing AC voltage) as compared to the voltage necessary to actuate the deflectable elements to a desired operation state (e.g. the ON state) is applied to the deflectable elements. With the applied AC voltage, the deflectable elements oscillate in the vicinity of their equilibrium state (e.g. the natural resting states). When the frequency of the AC voltage is approximately the intrinsic resonance frequency of the deflectable elements, the oscillation amplitudes of the deflectable elements are maximized.

The oscillations and the resonance frequencies can be measured by directing a light beam onto the reflective surfaces of the deflectable elements and measure the intensity of the reflected light beams from the oscillating deflectable elements. From the distribution of the measured resonance frequencies of the deflectable elements across the entire wafer, the uniformity information can be extracted and can be quantitatively and qualitatively analyzed.

For performing the quality inspection, an apparatus is setup, comprising a light source providing collimated light for illuminating the reflective deflectable elements on the wafer, and an image capture device for capturing reflected light from the deflectable elements. Due to the small dimension of the deflectable elements and larger cross-section of the incident light beam, a plurality of the elements on the wafer is illuminated at a time. A photodetector is disposed in the propagation path of the reflected light from the deflectable elements for collecting such reflected light, and transforms the intensity of the collected light into electrical signals. The transformed electrical signals are then delivered to a network analyzer and analyzed along with the AC voltage signals provided by the analyzer for oscillating the deflectable elements.

In operation, the analyzer sweeps the frequency of the AC voltage for a number of deflectable elements on the wafer. When the frequency of the AC voltage is approximately the intrinsic resonance frequencies of the number of deflectable elements, the intensity of the reflected light is maximized. Accordingly, the network analyzer detects a peak around the resonance frequency in the signal intensity vs. frequency plot. The resonance frequencies of the deflectable elements across the entire wafer are measured. Due to the variations of the deflectable elements (and/or the deformable elements whose properties determine the movements of the deflectable elements) in deflections and/or geographic configurations, the resonance frequencies of these elements exhibit a distribution across the wafer. Uniformity information of the elements on the wafer can thus be extracted from the frequency distribution, and quantitatively or qualitatively analyzed.

Fatso

Another exemplar quality inspection method is set forth in U.S. patent application Ser. No. 10/875,760, filed Jun. 23, 2004, the subject matter being incorporated herein by reference.

In this particular example, product quality and performances of micromirror array devices is inspected through measurements of the electromechanical responses of the individual micromirrors to the driving forces of electric fields. The electromechanical responses of the micromirrors according to the present invention are described in terms of the rotational angles associated with the operational states, such as the ON and OFF state angles of the ON and OFF state when the micromirror array device is operated in the binary-state mode, and the response speed (i.e. the time interval required for a micromirror device to transit form one state to another) of the individual micromirrors to the driving fields.

Specifically, a driving force is applied to the mirror plate of a micromirror being tested. In response, the mirror plate is deflected to different rotational angles determined by the amplitude and polarity of driving forces and the intrinsic mechanical and electrical properties of the micromirror being tested. The deflection of the mirror plate is monitored in a real-time fashion through the measurement of the intensities of the reflected light from the deflected mirror plate because the intensities of the reflected light are determined by the deflected positions of the individual mirror plates. And the dynamic variations of the intensities over time carry the information on the response speed of the mirror plate to the applied driving force. Therefore, from the intensities and the variation of the intensities of the reflected light, the electromechanical response of the micromirror to the driving force can be extracted. The same measurement can be conducted for all micromirrors of the micromirror array device, from which the electromechanical responses, such as the ON and OFF state angles and the response speed of all micromirrors of the micromirror array device can be obtained. Based on the extracted parameters, as well as predetermined criteria, the quality and performance of the microstructure device can be evaluated. For example, if all micromirrors of the micromirror array device have substantially the same ON and OFF state angle and substantially the same response speed, or the ON and OFF state angles and the response speed thereof have variations within respective predefined ranges, the micromirror array device may be acceptable as a "good" product. Otherwise, the micromirror array device is not acceptable and is marked as a "bad" product.

The measured electromechanical responses, in turn can be used as bases for optimizing the driving forces in practical operations of the microstructure devices. For example, the measurement results can be used to determine the optimum amplitudes and/or the profiles of the driving voltages for the micromirror array device in practical operations.

The corresponding experimental setup for measuring the electromechanical responses of the micromirror array device comprises an illumination system providing collimated light for illuminating the mirror plates of the micromirrors, an image capture device (e.g. a CCD device) for detecting intensities of the reflected light from the mirror plates of the micromirrors, and a set of optical elements for directing the light. A computing device having capacities of data process and control of other functional components of the experimental setup can also be provided for facilitating automated measurements in accordance with the methods of the invention. In particular, a plurality of program modules are constructed to perform the operations of, image analyses for determining the centers of the mirror plates, accepting parameters from the user for instructing controlling the applications of the driving forces to the mirror plates, analyzing the intensities of the reflected light from the mirror plates so as to extracting electromechanical response information of the individual micromirrors, and generating plots as appropriate. These program modules can be stored in and executed by the computer.

The measurement of the electromechanical responses of the micromirrors is preferably performed under a pressure lower than 1 atmosphere, such as around 20 Torr or less, or around 50 mTorr or less, or 15 mTorr or less.

It will be appreciated by those skilled in the art that a new and useful micromirror and micromirror array device and the method of making the same have been described herein. In view of the many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. Therefore, the invention as described herein contemplates all such embodiments as may come within the scope of the following claims and equivalents thereof.

We claim:

1. A method of fabricating a micromirror-array device, comprising:
   forming a plurality of reflective and deflectable mirror plates on a light transmissive substrate, comprising:
      depositing a sacrificial layer on the light transmissive substrate;
      forming the reflective mirror plate and a plurality of deformable hinges on the substrate and sacrificial layer, wherein the mirror plates are connected to the deformable hinges; and
      removing the sacrificial layer such that the mirror plates are capable of moving relative to the substrate;
   providing a semiconductor substrate having formed thereon a plurality of addressing electrode and circuitry;
   assembling the light transmissive substrate to the semiconductor substrate into a micromirror assembly such that the mirror plates are associated with the addressing electrodes;
   placing the micromirror assembly on a package substrate;
   cleaning the micromirror assembly; and applying an anti-stiction agent to a contacting surface in the micromirror assembly;
   disposing a lubricant material;
   dispensing a getter material;
   hermetically sealing the micromirror assembly within a space between the package substrate and a package lid that is transmissive to visible light so as to form a packaged device;
   baking the packaged device; and
   testing the quality of the packaged device.

2. The method of claim 1, wherein the step of forming the reflective mirror plate and deformable hinge further comprises:
   forming the mirror plates and deformable hinges with another sacrificial layer disposed therebetween such that the mirror plates and deformable hinges are in separate planes parallel to the light transmissive substrate.

3. The method of claim 1, wherein step of removing the sacrificial layer further comprising:
   applying a breakthrough etch for removing a portion of the sacrificial layer; and
   applying an etch using a spontaneous vapor phase etchant.

4. The method of claim 3, wherein the vapor phase etchant comprises a noble gas halide.

5. The method of claim 4, wherein the noble gas halide is xenon difluoride.

6. The method of claim 3, wherein the vapor phase etchant comprises an interhalogen.

7. The method of claim 6, wherein the interhalogen is $BrF_3$.

8. The method of claim 3, wherein the etchant is mixed with a dilution gas.

9. The method of claim 8, wherein the dilution gas comprises inert gas.

10. The method of claim 1, wherein the step of removing the sacrificial material further comprises:
    removing a first portion of the sacrificial layer using a plasma etching with a spontaneous vapor phase etchant; and
    removing a second portion of the sacrificial layer with the spontaneous vapor phase etchant in the absent of plasma.

11. The method of claim 1, further comprising:
    exposing the deformable hinge in an oxygen-containing gas other than air so as to oxide the deformable hinge.

12. The method of claim 11, wherein the step of exposure is performed after the deformable hinge is formed.

13. The method of claim 11, wherein the step of exposure is performed after the step of removing the sacrificial layer.

14. The method of claim 11, wherein the step of exposure is performed after the step of assembling.

15. The method of claim 11, wherein the step of exposure is performed after the step of baking.

16. The method of claim 1, further comprising:
    annealing the deformable hinge.

17. The method of claim 1, further comprising:
    deflecting the mirror plate at a deflected state other the natural resting state for a predetermined time period so as to straining the deformable hinge.

18. The method of claim 1, wherein the step of applying an anti-stiction material further comprises:
    forming a self-assembly-monolayer on the contacting surface.

19. The method of claim 1, wherein the step of assembling further comprises:
    bonding the light transmissive and semiconductor substrate with a micro-opening formed between the two substrate, wherein the micro-opening having a characteristic dimension of 10 microns or less.

20. The method of claim 1, wherein the step of hermetically sealing further comprises:
    attaching the package lid to the package substrate;
    driving an electrical current through an embedded heater in the package substrate so as to control a temperature at a bonding area between the package lid and package substrate within a range from 180° C. to 250° C.

21. The method of claim 20, wherein the package lid and package substrate are bonded with a sealing media comprising $Au_cSn_y$, wherein a ratio of x:y is from 10:90 to 80:20.

* * * * *